United States Patent
Kondoh et al.

(10) Patent No.: US 7,476,619 B2
(45) Date of Patent: Jan. 13, 2009

(54) SEMICONDUCTOR DEVICE

(75) Inventors: Eiichi Kondoh, 472-51, Nakashimojo, Shikishima-Machi, Nakokoma-Gun, Yamanashi (JP) 400-0124; Vincent Vezin, Kyoto (JP); Kenichi Kubo, Kofu (JP); Yoshinori Kureishi, Fuchu (JP); Tomohiro Ohta, Nirasaki (JP)

(73) Assignees: Tokyo Electron Limited, Tokyo (JP); Eiichi Kondoh, Nakakoma-Gun (JP)

( * ) Notice: Subject to any disclaimer, the term of this patent is extended or adjusted under 35 U.S.C. 154(b) by 307 days.

(21) Appl. No.: 10/543,378

(22) PCT Filed: Dec. 26, 2003

(86) PCT No.: PCT/JP03/16990

§ 371 (c)(1),
(2), (4) Date: Jul. 26, 2005

(87) PCT Pub. No.: WO2004/095557

PCT Pub. Date: Nov. 4, 2004

(65) Prior Publication Data

US 2006/0154482 A1 Jul. 13, 2006

(30) Foreign Application Priority Data

Jan. 27, 2003 (JP) ............................. 2003-017948

(51) Int. Cl.
*H01L 21/44* (2006.01)
(52) U.S. Cl. ................ 438/687; 438/677; 438/658; 257/E21.48; 257/E21.478; 427/377
(58) Field of Classification Search ............... 438/687, 438/677, 658, 909; 427/377, 378; 257/E21.438, 257/E21.478, E21.479, E21.584, E21.224, 257/E21.295
See application file for complete search history.

(56) References Cited

U.S. PATENT DOCUMENTS 5,789,027 A    8/1998    Watkins et al.

(Continued)

FOREIGN PATENT DOCUMENTS

JP    02-209729    8/1990

(Continued)

OTHER PUBLICATIONS

Blackburn, Jason M. et al. "Deposition of Conformal Copper and Nickel Films from Supercritical Carbon Dioxide", Science, vol. 294, pp. 141-145 2001.

*Primary Examiner*—Caridad M Everhart
(74) *Attorney, Agent, or Firm*—Oblon, Spivak, McClelland, Maier & Neustadt, P.C.

(57) ABSTRACT

An object of the invention is to make it possible to perform the embedding of a Cu diffusion preventing film and a Cu film to a fine pattern of a high aspect ratio by using a medium of a supercritical state in a manufacturing process of a semiconductor device. The object of the invention is achieved by a substrate processing method comprising a first step of processing a substrate by supplying a first processing medium containing a first medium of a supercritical state onto the substrate, a second step of forming a Cu diffusion preventing film on the substrate by supplying a second processing medium containing a second medium of a supercritical state onto the substrate, and a third step of forming a Cu film on the substrate by supplying a third processing medium containing a third medium of a supercritical state onto the substrate.

21 Claims, 19 Drawing Sheets

U.S. PATENT DOCUMENTS

| | | | |
|---|---|---|---|
| 6,890,853 B2 * | 5/2005 | Biberger et al. | 438/670 |
| 2002/0001929 A1 | 1/2002 | Biberger et al. | |
| 2005/0260846 A1 | 11/2005 | Kondoh et al. | |
| 2006/0178006 A1 * | 8/2006 | Xu et al. | 438/643 |

FOREIGN PATENT DOCUMENTS

| | | |
|---|---|---|
| JP | 2000-235965 | 8/2000 |
| WO | 01/82368 | 11/2001 |

\* cited by examiner

SEMICONDUCTOR DEVICE

TECHNICAL FIELD

The present invention relates to a substrate processing method and a semiconductor device manufacturing method, and further relates to a method of depositing a metal film.

BACKGROUND ART

In recent years, high integration of semiconductor devices progresses with high performance of semiconductor devices, and the demand of fine wiring patterns is increasing. The wiring rule on the order of 0.13 to 0.10 micrometers or less is under development. And, aluminum (Al) as the conventional wiring material has been substituted for by copper (Cu) which has a low resistance with little influence of wiring delay.

Therefore, the combination of the Cu film formation technology and the fine wiring technology serves as an important key technology for the multilevel interconnection technology in recent years.

The sputtering method, the CVD method, the plating method, etc. are generally known as the above mentioned method for film deposition of Cu. However, when taking into consideration the fine wiring technology, each method has a limited coverage, and it is very difficult to form a Cu film efficiently in a fine pattern which is at a high aspect ratio of 0.1 micrometer or less.

Then, as a method of efficiently forming a Cu film in a fine pattern, a method for film deposition of Cu using a medium of a supercritical state is proposed (see "Deposition of Conformal Copper and Nickel Films from Supercritical Carbon Dioxide", SCIENCE vol. 294, Oct. 5, 2001, www.sciencemag.org).

According to the literature "Deposition of Conformal Copper and Nickel Films from Supercritical Carbon Dioxide", a Cu film formation precursor compound (precursor) which contains Cu is dissolved using CO2 of a supercritical state, and a Cu film is formed.

The term "supercritical state" means that the substance concerned is in the state of having the features of a gas and a liquid, when the temperature and pressure of the substance concerned become beyond a value (critical point) peculiar to the substance concerned.

For example, in the above-mentioned medium using CO2 of the supercritical state, the Cu film formation precursor which is the precursor compound containing Cu has a high solubility but has a low viscosity and a high diffusibility, and the Cu film formation is attained in a fine wiring pattern of a high aspect ratio.

The embedding of Cu to a fine pattern is introduced in the above literature "Deposition of Conformal Copper and Nickel Films from Supercritical Carbon Dioxide".

However, when actually creating a semiconductor device by the above-mentioned Cu film formation, it is necessary to form the diffusion preventing film of Cu between Cu and an insulating layer, in order to prevent diffusion of Cu to the inside of the insulating layer between the Cu wirings, for example.

It is known that any of a metal film, a metal nitride film or a laminated film of a metal film and a metal nitride film may be used as the Cu diffusion preventing film, and the metal is chosen from a group including Ti, Ta, W, TiN, TaN, WN, etc.

The sputtering method has been conventionally used for formation of the above-mentioned Cu diffusion preventing film. However, it is difficult to provide a sufficient coverage for a fine pattern of the recent semiconductor devices, and the sputtering method has such difficulty.

In recent years, the CVD method which provides a good coverage has been used in many cases instead of the sputtering method. However, the current situation is that if it is applied to a fine pattern of a high aspect ratio of 0.1 micrometers or less, the coverage of the CVD method is also inadequate.

Moreover, when formation of a Cu film using the medium of a supercritical state is considered, a decompression process is required in addition to a pressurization process for the sputtering method or the CVD method, and it is necessary to prepare two kinds of devices with different configurations. Further, it is necessary to convey a substrate between a pressure reduction device and a pressurization device, and there is a problem that the productivity is low.

DISCLOSURE OF THE INVENTION

A general object of the present invention is to provide a new and useful substrate processing method and semiconductor device manufacturing method in which the above-mentioned problems are eliminated.

A more specific object of the present invention is to provide a substrate processing method which enables the embedding of a Cu diffusion preventing film and a CU film in a fine pattern of a high aspect ratio by using a medium of a supercritical state.

In order to achieve these objects, the present invention provides a substrate processing method comprising: a first step of processing a substrate by supplying a first processing medium containing a first medium of a supercritical state onto the substrate; a second step of forming a Cu diffusion preventing film on the substrate by supplying a second processing medium containing a second medium of a supercritical state onto the substrate; and a third step of forming a Cu film on the substrate by supplying a third processing medium containing a third medium of a supercritical state onto the substrate.

According to the above-described invention, it is possible to perform both the formation of a Cu diffusion preventing film and the embedding of a Cu film using a medium of a supercritical state.

Since the solubility of the precursor compound containing a metal (for example, Cu or Ta) in the medium of the supercritical state is high, and the precursor compound is rich in mobility and its diffusibility is high, even in a very fine pattern, the formation of the Cu diffusion preventing film and the embedding of the Cu film can be performed.

Moreover, if the above-described substrate processing method is applied to a semiconductor device manufacturing method, it is possible to perform both the formation of a Cu diffusion preventing film and the embedding of a Cu film in a semiconductor device by using a medium of a supercritical state.

Since the medium of a supercritical state has the high solubility of the precursor compound containing a metal (for example, Cu or Ta) and the precursor compound is rich in mobility and its diffusibility is high, even in a very fine pattern, the formation of the Cu diffusion preventing film and the embedding of the Cu film can be performed, and the manufacture of a semiconductor device having a fine pattern is attained.

BEST MODE FOR CARRYING OUT THE INVENTION

A description will now be given of the embodiments of the invention with reference to the accompanying drawings.

The First Embodiment

Figure 1:
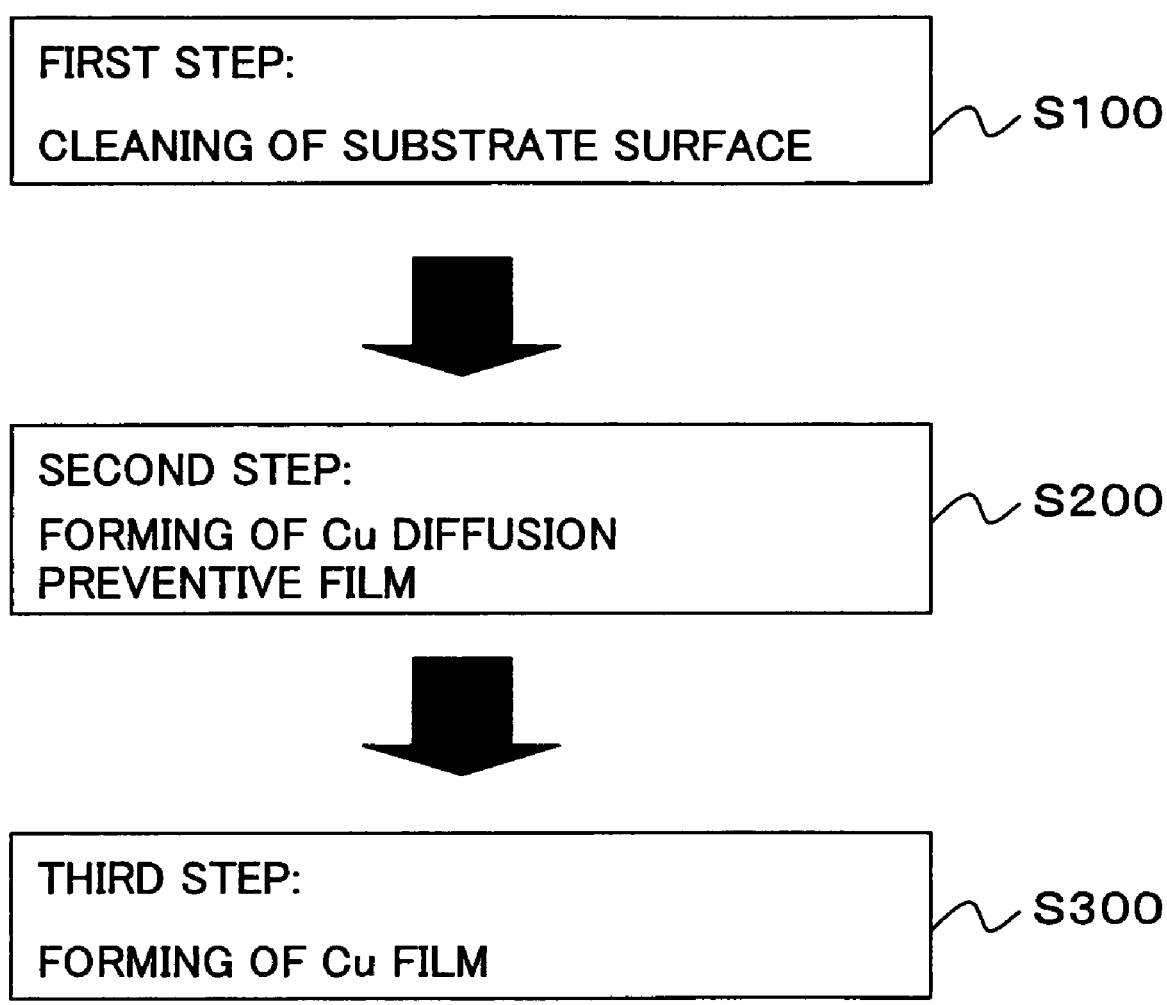
FIG. 1 is a diagram showing the process flow of the substrate processing method according to the invention.

FIG. 1 shows the process flow of the substrate processing method according to the invention.

In this process, the following steps are performed by using the $CO_2$ of the supercritical state or the nitrogen compound of the supercritical state as described above.

As shown in FIG. 1, the substrate processing method comprises the cleaning of the surface of the processed substrate which is the first step (step S100), the film formation of Cu diffusion preventing film which is the second step (step S200), and the film formation of Cu film which is the third step (step S300).

First, in the first step, the oxide film of Cu formed on the substrate (for example, on the surface of Cu film) is removed by using the processing medium with the etching agent dissolved in $CO_2$ of the supercritical state.

By removing the oxide film on the Cu film, it becomes possible to reduce the electric contact resistance (contact resistance) value of the Cu film concerned and the Cu diffusion preventing film formed at the following second step.

Next, in the second step, any of a metal film, a metal nitride film, or a laminated film of a metal film and a metal nitride film is formed as a Cu diffusion preventing film on the Cu film surface which was cleaned in the first step.

For example, when forming the laminated film of the metal film and the metal nitride film, the metal film is first formed by using the processing medium with the metal film formation precursor (which is the precursor compound containing the metal) dissolved in $CO_2$ of a supercritical state. Next, the metal nitride film is formed by using the processing medium with the metal film formation precursor dissolved in the nitrogen compound of a supercritical state or the medium in which $CO_2$ of the supercritical state is mixed with the nitrogen compound of the supercritical state. At this process, using $CO_2$ of the supercritical state or the nitrogen compound enables efficient formation of a Cu diffusion preventing film in a fine pattern.

At the third step, the Cu film is formed by using the processing medium with the Cu film formation precursor (which is the precursor compound containing Cu) dissolved in $CO_2$ of the supercritical state. At this process, using $CO_2$ of the supercritical state enables efficient formation of a Cu film in a fine pattern.

Next, the substrate processing device which performs the substrate processing method will be explained using the accompanying drawings.

The Second Embodiment

Figure 2:
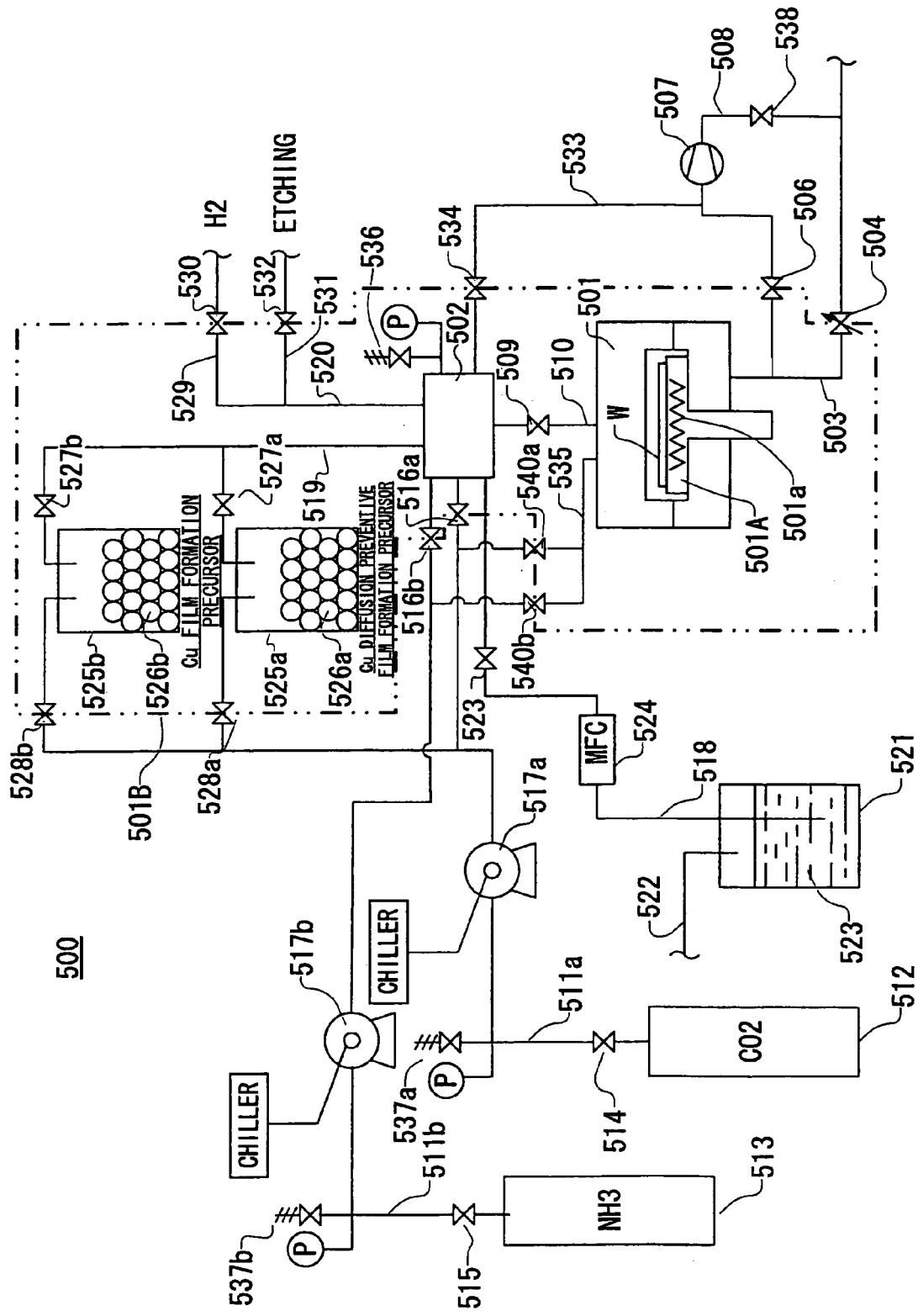
FIG. 2 is a diagram showing the composition of the substrate processing device which performs substrate processing according to the invention.

FIG. 2 shows the composition of the substrate processing device 500 which can perform the substrate processing method according to the invention.

As shown in FIG. 2, the substrate processing device 500 comprises an exhaust system including the processing container 501 having the substrate holding stand 501A in which the substrate heater 501a is built, the gas mixer 502 which supplies to the processing container 501 the processing medium containing the medium of the supercritical state for performing substrate processing, and the exhaust line 503 which exhausts the processing container 501.

The semiconductor wafer W which is the processed substrate is laid in the mounting base 501A. The processing medium containing the medium of a supercritical state from the gas mixer 502 is supplied to the processing container 501, so that substrate processing is performed.

The processing medium concerned after the substrate processing is discharged from the exhaust line 503 by opening valve 504, and the processing container 501 is almost in an atmospheric pressure state.

When exhausting the inside of the processing container 501 to below the atmospheric pressure, it is possible to carry out evacuation from the evacuation line 508 using the vacuum pump 507 by opening the valve 506 and valve 538.

The gas mixer 502 which forms the processing medium and supplies the processing medium concerned to the processing container 501 is connected to the processing container 501 via the supply line 510 in which the valve 509 is attached.

By mixing the medium of a supercritical state and a predetermined additive in the gas mixer 502, the processing medium is formed, and the processing medium is supplied to the processing container 501.

The pressurization line 511a to which the liquid $CO_2$ supply unit 512 is connected is connected to the gas mixer 502.

In the pressurization line 511a, the valve 514 and valve 516a are opened, and CO2 is supplied to the gas mixer 502 from the liquid CO2 supply unit 512. In that case, the booster pump 517a installed in the pressurization line 511a is operated, so that CO2 being supplied to the gas mixer 502 is pressurized to the supercritical state.

The booster pump 517a is cooled by the chiller so that the temperature rise under operation may be suppressed and CO2 in the state of a liquid may be pressurized.

In addition, NH3 may be supplied to the gas mixer 502 from the liquid NH3 supply unit 513 by opening the valve 515 and valve 516b in the pressurization line 511b. In that case, the booster pump 517b installed in the pressurization line 511b is operated so that NH3 supplied to the gas mixer 502 is pressurized to the supercritical state.

The booster pump 517b is cooled by the chiller so that the temperature rise under operation may be suppressed and NH3 in the state of a liquid may be pressurized.

It is also possible to generate the medium of the supercritical state in which CO2 of the supercritical state and NH3 of the supercritical state are mixed, by opening the valves 514 and 516a and the valves 515 and 516b. The valves 514 and 516a and the valves 515 and 516b may be opened simultaneously. Alternatively, the valves 514 and 516a may be opened first, or the valves 515 and 516b may be opened first.

A heater is installed in the gas mixer 502, the processing container 501, the supply line 510, a part of the pressurization line 511a, a part of the pressurization line 511b, the valve 516a, and the valve 516b. They are heated and CO2 and NH3 are set in a supercritical state exceeding a critical point. The area of the substrate processing device 500 where the heater is installed and the heating is performed to create the supercritical state is indicated by the area 501B in FIG. 2.

Moreover, the liquid material supply line 518, the solid material supply line 519, and the gas supply line 520 are connected to the gas mixer 502. The liquid material, the solid material, and the gas are respectively dissolved in or mixed with the medium of the supercritical state, so that the processing medium is created and it is supplied to the processing container 501.

The liquid material supply line 518 will first be explained. The liquid material supply line 518 is connected to the liquid material container 521 holding the liquid material 523. The liquid material container 521 is pressurized by the inert gas supplied from the gas line 522 linked to the inert gas supply unit which is not illustrated. The liquid material 523 concerned is supplied to the gas mixer 502 from the liquid material supply line 518 by opening the valve 523.

In that case, the liquid material 523 supplied is adjusted to a predetermined flow rate by the mass flow rate controller 524 installed in the liquid gas supply line 518. The supplied liquid material 523 is mixed with the medium of the supercritical state in the gas mixer 502, and it is supplied to the processing container 501.

The solid material supply line 519 will be explained next. The solid material supply line 519 supplies the solid material 526a or 526b which is dissolved in CO2 which is the medium of the supercritical state, to the gas mixer 502 with the medium of the supercritical state concerned.

First, the feeding method of the solid material 526a will be explained. The valve 528a and the valve 514 are opened beforehand, and CO2 is supplied to the solid material container 525a from the liquid CO2 supply unit 512 via the pressurization line 511a. In that case, the booster pump 517a installed in the pressurization line 511a is operated so that CO2 supplied to the solid material container 525a is pressurized to the supercritical state.

The processing medium in which the solid material 526a is dissolved enough in CO2 which is the medium of the supercritical state is created beforehand. Then, the valve 527a is opened and the processing medium concerned is supplied to the gas mixer 502 which is filled beforehand with the medium of the supercritical state. The processing medium supplied to the gas mixer 502 is supplied to the processing container 501 from the supply line 510 by opening the valve 509.

As for the solid material 526b, similarly, the valve 528b and the valve 514 are opened beforehand, and CO2 is supplied to the solid material container 525b from the liquid CO2 supply unit 512 via the pressurization line 511b. In that case, the booster pump 517b installed in the pressurization line 511b is operated, so that CO2 supplied to the solid material container 525b is pressurized to the supercritical state.

The processing medium in which the solid material 526b is dissolved enough in CO2 which is the medium of the supercritical state is created beforehand. Then, the valve 527b is opened and the processing medium concerned is supplied to the gas mixer 502 which is filled beforehand with the medium of the supercritical state. The processing medium supplied to the gas mixer 502 is supplied to the processing container 501 from the supply line 510 by opening the valve 509.

Next, the gas supply line 520 will be explained. The H2 supply line 529 in which the valve 530 is attached, and the etching agent supply line 531 in which the valve 532 is attached are connected to the gas supply line 520, and the gas supply line 520 can supply H2 and the etching agent to the gas mixer 502, respectively. The H2 and the etching agent supplied are mixed with the medium of the supercritical state in the gas mixer, and it is supplied to the processing container 501.

Thus, the substrate processing device 500 can perform substrate processing by using the processing medium in which the solid material, the liquid material, or the gas is dissolved in or mixed with the medium of the supercritical state.

The pressurization lines 511a and 511b are connected to the processing container 501 via the preliminary pressurization line 535 in which the valve 540a or 540b is attached. Hence, it is possible to raise the pressure of the processing container 501 via the preliminary pressurization line 535 concerned without passing through the gas mixer 502.

The pressure open valves 536, 537a, and 537b are installed in the gas mixer 502, the pressurization line 511a, and the pressurization line 511b, respectively, for the purpose of preventing the abnormal rise of the pressure.

The processing container 501 is adjusted to a predetermined pressure through the exhaust line 503 by the back pressure regulating valve 504, it is possible to prevent the abnormal rise of the pressure.

Next, the process flow when the substrate processing method according to the invention is performed using the substrate processing device 500 will be explained.

The Third Embodiment

As described above, the substrate processing method according to the invention comprises the first step, the second step, and the third step.

Next, the detailed flow of each of the first through third steps will be explained using the drawings. However, the elements which are the same as corresponding elements explained previously are designated by the same reference numerals, and a description thereof will be omitted.

Figure 3:
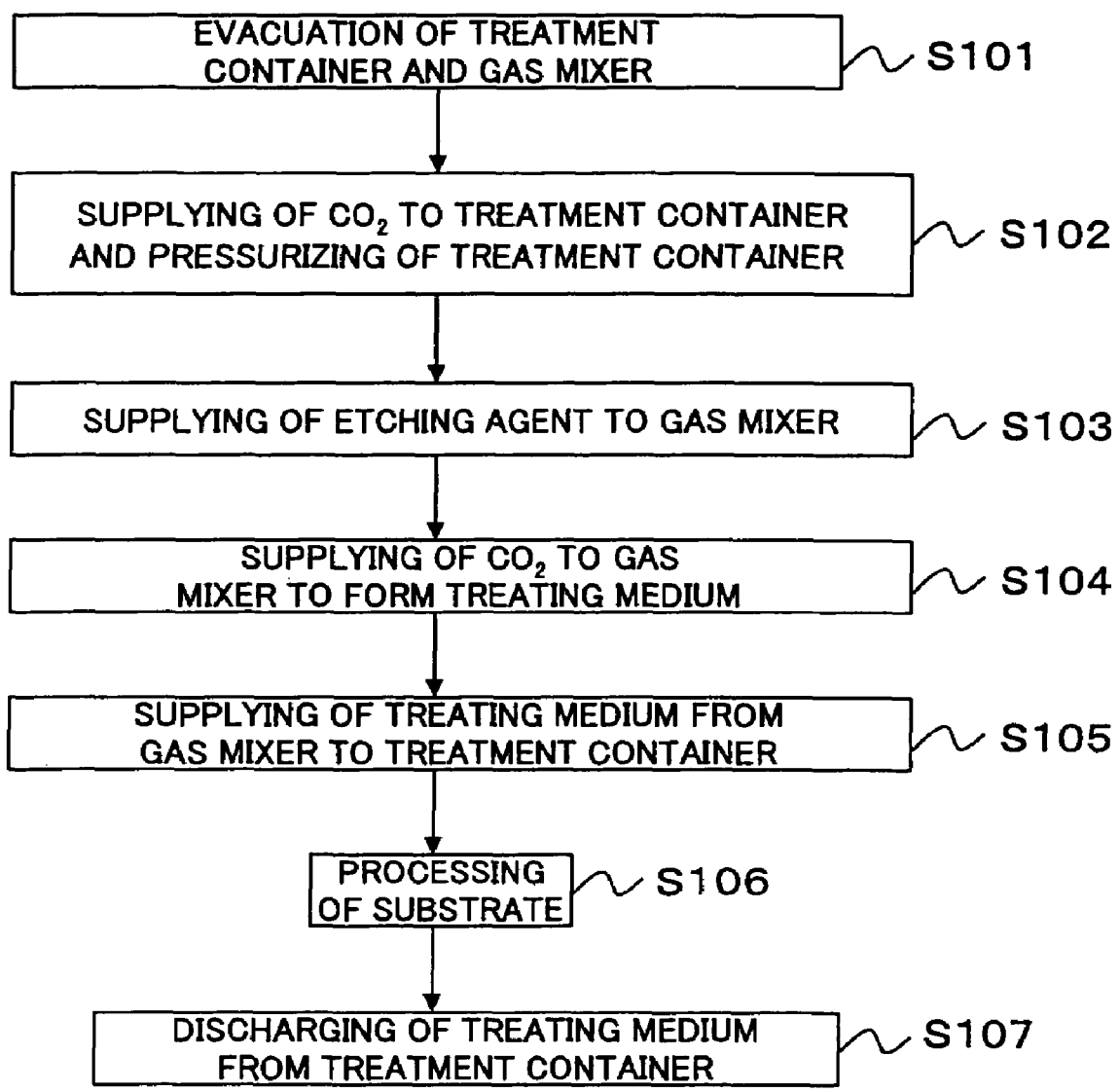
FIG. 3 is a diagram showing the process flow of the substrate processing method according to the invention.

FIG. 3 shows the process flow of the contents of the first step in the third embodiment.

As shown in FIG. 3, the first step of the substrate processing method of this embodiment comprises steps 101 to 107 (indicated as S101 to S107 in the drawing).

The processing of the wafer W laid in the substrate holding stand 501A is performed. In step 101, the valves 506, 534, and 538 are opened, and evacuation of the processing container 501 and the gas mixer 502 is performed by the vacuum pump 507.

The valves 506, 534, and 538 are closed after the termination of evacuation concerned. Alternatively, evacuation of the gas mixer 502 through the processing container 501 may be performed by opening the valve 509 without opening the valve 534.

Next, in step 102, the valve 514 and the valve 540a are opened, and CO2 is supplied to the processing container 501. In that case, pressurization is performed using the booster pump 517a, and the area 501B including the processing container 501 and the gas mixer 502 is heated by the heater. Thus, CO2 in the processing container 501 is made in the condition that the critical point of CO2 concerned is exceeded.

Moreover, the booster pump 517a is cooled by the chiller. The CO2 is prevented from becoming a gas, and the CO2 in a liquid state is pressurized.

At the critical point, the temperature of CO2 concerned is 31.03 degrees C., and the pressure thereof is 7.38 MPa. The temperature and pressure of the processing container 501 is controlled to above the critical point concerned, and the processing container 501 is in the state that is filled with CO2 of the supercritical state.

Then, the valve 514 and the valve 540a are closed. Thus, the inside of the processing container 501 is filled with CO2 of the supercritical state beforehand, and when the processing medium containing CO2 of the supercritical state is subsequently introduced into the processing container 501, the processing medium concerned can be maintained in the supercritical state, and the processing medium of the supercritical state dissolved in a high concentration can be maintained.

When the processing container 501 concerned is set at the predetermined pressure, the wafer W is heated by the substrate heater 501a, and it is made at the temperature in a range of 200 degrees C. to 400 degrees C.

Next, in step 103, by opening the valve 532, the etching agent is supplied to the gas mixer 502 of a decompression state from the etching agent supply line 531, the inside of the gas mixer 502 is filled with the etching agent concerned. After a predetermined time progresses, the valve 532 is closed.

Next, in step 104, the valve 516a is opened and the CO2 is introduced into the gas mixer 502 and pressurized to the supercritical state with the booster pump 517a which is beforehand cooled with the chiller. The etching agent is fully spread and mixed to form the processing medium. The valve 516a is closed at a predetermined supercritical pressure.

Next, in step 105, the valve 509 is opened, and the processing medium containing CO2 of the supercritical state is introduced into the processing container 501 from the gas mixer 502. Pressure regulation is performed by opening and closing of the valve 516a if needed, and the processing medium in the gas mixer 502 is conveyed to the processing container 501.

Next, in step 106, substrate processing is performed by the processing medium concerned. Preliminary pressurization to the supercritical state of the processing container of step 102 may be performed between step 104 and step 105.

For example, the reaction which removes a CuOx film formed in a Cu surface on the surface of the processed substrate takes place by the etching agent dissolved in CO2 of the supercritical state.

Concerning the by-product which is created after the reaction, the CO2 of the supercritical state is easy to dissolve, and the reattachment to the substrate does not take place.

The etching agent used may include a chelating agent, a halogenated compound, an acid, and an amine. Specifically, H(hexafluoroacetylacetonate) can be used as the chelating agent, HCl can be used as the acid, and ClF3 can be used as the halogenated compound. Such etching agent removes the oxide film on the surface of Cu with the CO2 of the supercritical state.

Thus, it is possible to reduce the contact resistance of the Cu diffusion preventing film formed in the second step and the Cu film, by removing the oxide film on the surface of Cu concerned.

Other etching agents that may be used include acetylacetone, 1,1,1-trifluoro-pentane-2,4-dione, 2,6-dimethyl-pentane-3,5-dione, 2,2,7-trimetyloxane-2,4-dione, 2,2,6,6-tetramethylheptane-3,5-dione, EDTA (ethylenediaminetetraacetic acid), NTA (nitrilotriacetic acid), acetic acid, formic acid, oxalic acid, maleic acid, glycolic acid, citrate, malic acid, lactic acid, amino acid, triethanolamine, etc.

Thus, in the step 106, it is possible to reduce the electric contact resistance (contact resistance) value of the Cu diffusion preventing film formed in the second step and the Cu film, by removing the oxide film on the surface of Cu concerned.

Next, in step 107, the valve 504 is opened, the processing medium and the reaction secondary product in the processing container 501 and the gas mixer 502 are discharged, and the first step is ended.

Figure 4:
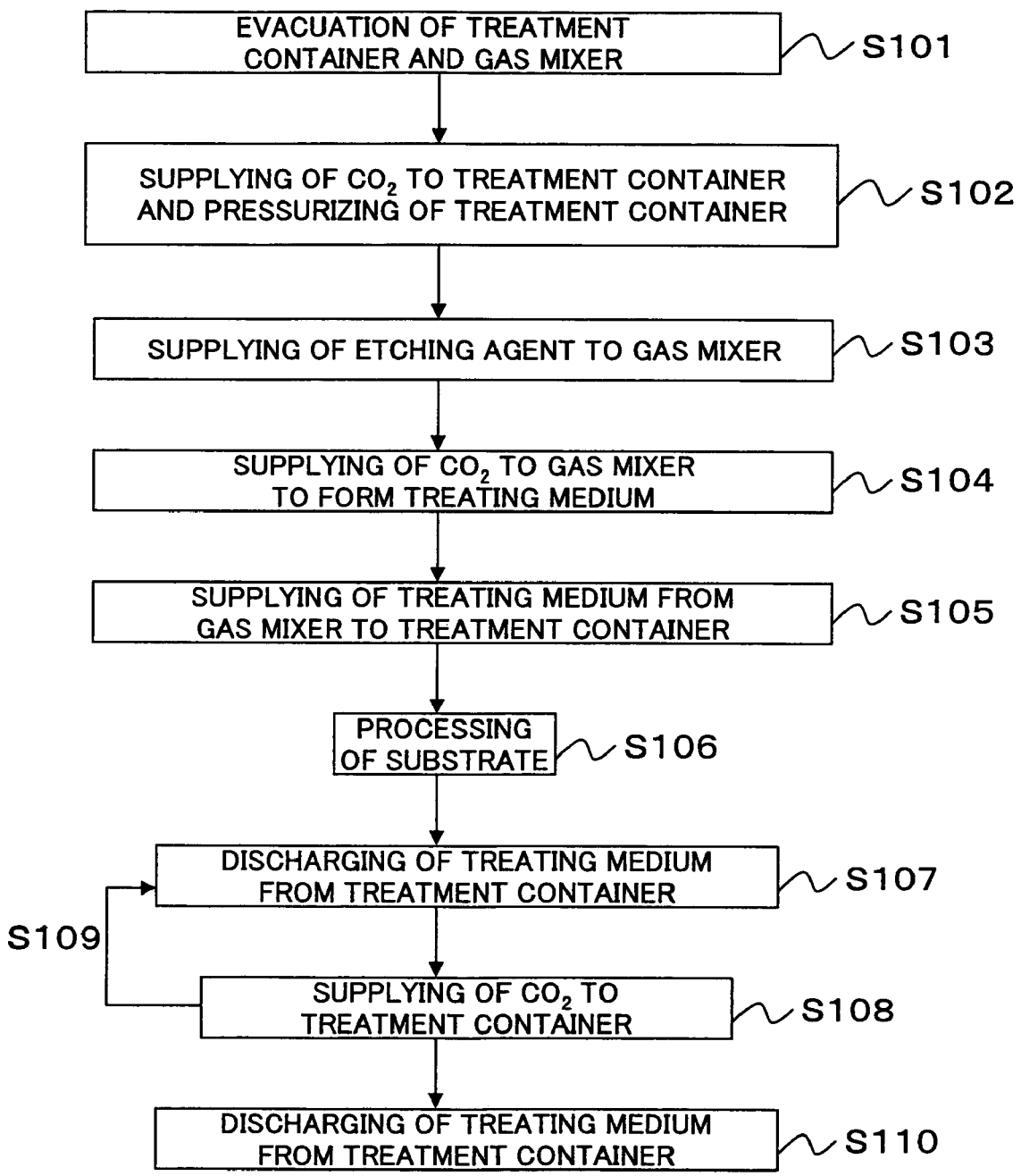
FIG. 4 is a diagram showing the process flow of the substrate processing method according to the invention.

After the step 107, as further shown in FIG. 4, a rinse process may be added.

The Fourth Embodiment

FIG. 4 shows the modification of the third embodiment shown in FIG. 3.

In FIG. 4, the elements which are the same as corresponding elements in FIG. 3 are designated by the same reference numerals, and a description thereof will be omitted. Namely, steps 101 to 107 in FIG. 4 are the same as those in FIG. 3, and a description thereof will be omitted.

In step 108, the valve 504 is closed, the valve 516a is opened, and the inside of the gas mixer and the processing container 501 is filled with CO2 of the supercritical state. After this, the valve 516a is closed.

Then, CO2 of the supercritical state is discharged from the processing container 501 and the gas mixer 502 by opening the valve 504 again in step 110.

It becomes possible to discharge the un-reacted processing medium and the by-product adhering to the wafer W and the inner wall of the processing container 501, out of the processing container 501 by performing the process of the steps 108 to 110.

The residue and the reaction secondary product described above can be removed by returning from the step 108 to the step 107 at the step 109 and repeating the rinse process of the steps 107 and 108 two or more times from the step 108, if needed.

The Fifth Embodiment

Next, the contents of the process flow of the second step will be explained as the fifth embodiment.

The Cu diffusion preventing film is formed at the second step. As described above, the Cu diffusion preventing film comprises a metal film, a metal nitride film, or a laminated film of the metal film or the metal nitride film. In this embodiment, the case where the laminated film of the metal film and the metal nitride film is formed will be described.

Therefore, the formation process of the Cu diffusion preventing film in this embodiment comprises a first half process which forms the metal film, and a second half process which forms the nitride film of the metal concerned.

Figure 5:
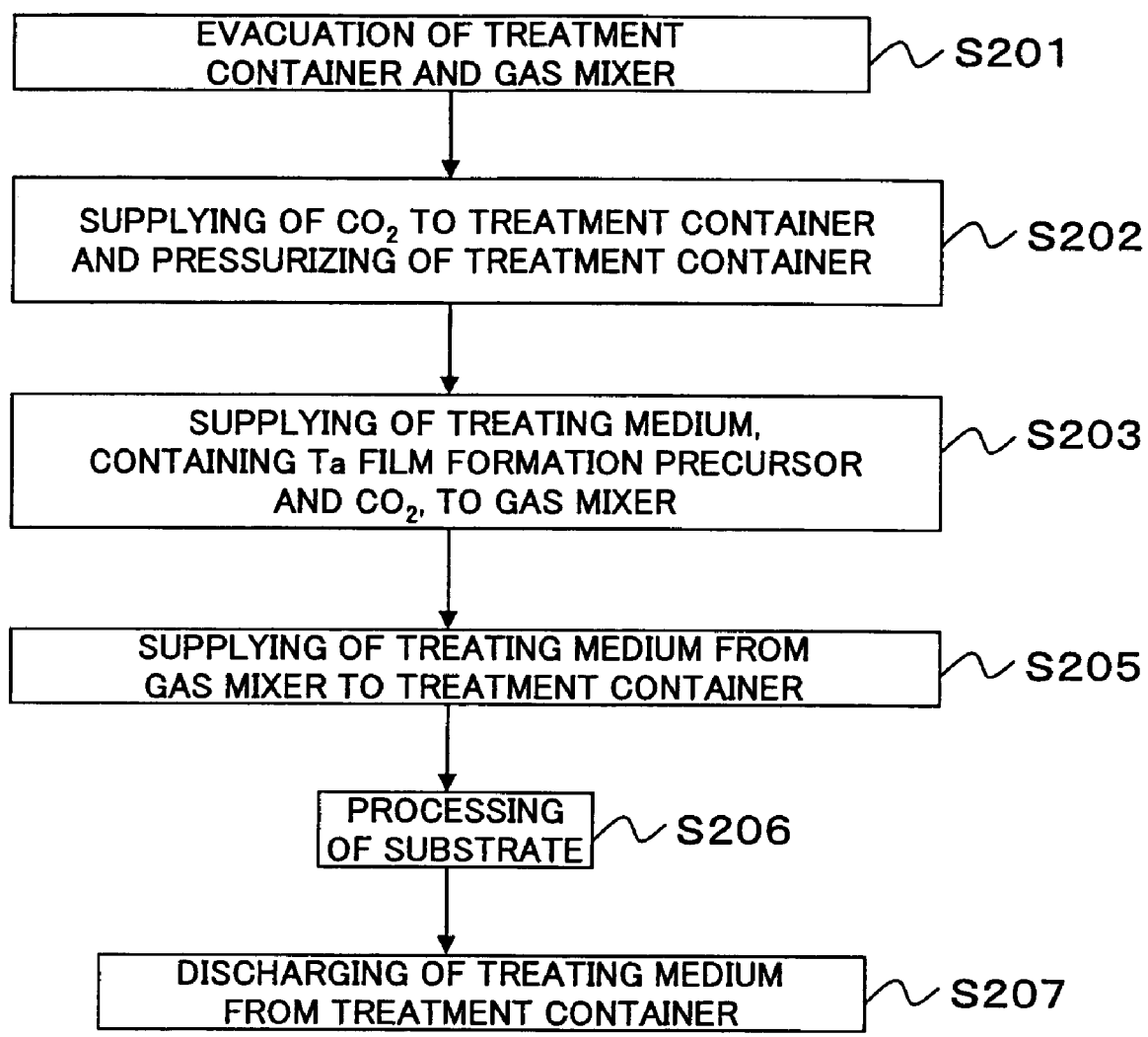
FIG. 5 is a diagram showing the process flow of the substrate processing method according to the invention.

The first half process of the second step is shown in FIG. 5.

With reference to FIG. 5, step 201 and step 202 are the same as the step 101 and the step 102 described above. However, the wafer W is maintained at 250 degrees C.-500 degrees C. by the substrate heater 501a.

Next, in step 203, the solid material 526a which is the Ta film formation precursor held at the solid material container 525a is introduced into the gas mixer 502.

Before shifting to this step 203, the valves 514 and 528a are opened beforehand, and the solid material container 525a is changed into a pressurization state by CO2 using the booster pump 517.

The processing container 525a is in the range of the area 501B, and it is heated with the heater, and therefore CO2 of the supercritical state is generated within the solid material container 525a.

Furthermore, CO2 of the supercritical state concerned has a high solubility of the precursor, the solid material 526a which is the Ta film formation precursor (which is TaF5, for example) is fully dissolved in CO2 of the supercritical state, and the processing medium is formed.

Thus, in this step 203, the valve 527a is opened, and the processing medium concerned are supplied to the gas mixer 502.

In order to maintain the pressure of the solid material container 525a in that case, the valve 528a is opened and closed, if needed.

After opening the valve 527a for a predetermined time, the valve 527a is closed.

Next, in step 205, the valve 509 is opened and the processing medium concerned which contains CO2 of the supercritical state from the gas mixer 502 is introduced into the processing container 501 from the gas mixer 502.

Pressure regulation is performed by opening and closing of the valve 516 if needed, and the supercritical state of CO2 is maintained.

In the following step 206, film formation of Ta film is performed on the wafer W which is the processed substrate, and it shifts to the following step 207 after a predetermined time progresses.

In this step, the wafer W is maintained at 250 degrees C.-500 degrees C. by the substrate heater 501a.

As described above, CO2 of the supercritical state has a high mobility, a very high solubility and a good diffusibility, and it enables efficient formation of the metal film concerned on the bottom and side wall of a fine pattern of 0.1 micrometer or less, and it is possible to acquire good coverage of the metal film on the pattern.

The following step 207 is the same as the step 107. In this embodiment, $TaF_5$ which is a halogenated compound is used as the Ta film formation precursor. However, the same result is obtained even if any of $TaCl_5$, $TaBr_5$, and $TaI_5$ is used as a halogenated compound.

Even if any of $(C_5H_5)_2TaH_3$, $(C_5H_5)_2TaCl_3$, etc. is used as a precursor of an organic metal, it is possible to obtain the same result.

The Sixth Embodiment

Figure 6:
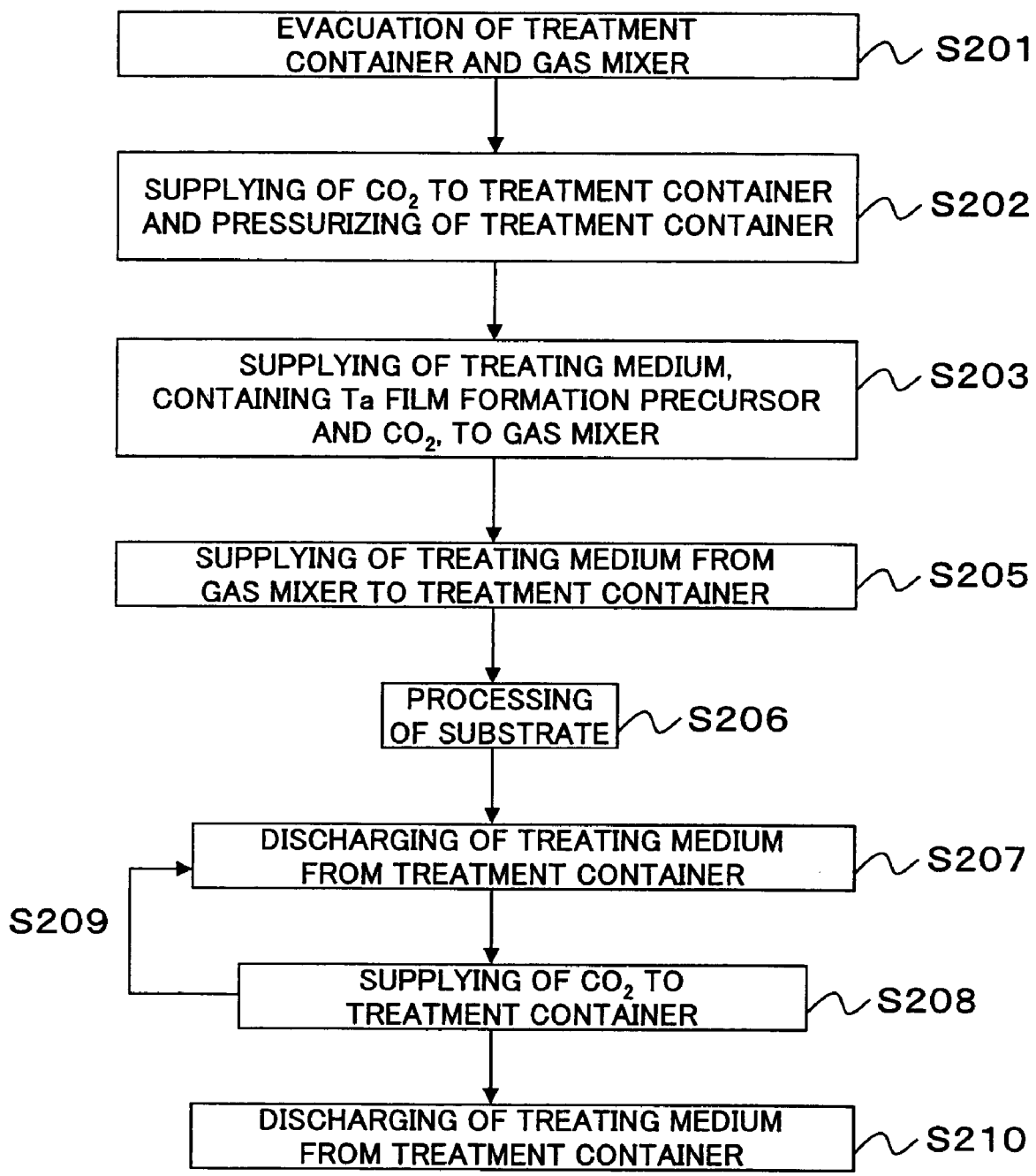
FIG. 6 is a diagram showing the process flow of the substrate processing method according to the invention.

The fifth embodiment shown in FIG. 5 may be modified like the sixth embodiment shown in FIG. 6.

The process flow in the first half of the second step is shown in FIG. 6. In FIG. 6, the elements which are the same as corresponding elements in FIG. 5 are designated by the same reference numerals, and a description thereof will be omitted.

The steps 208-210 in FIG. 6 are the same rinse processes as the steps 108-110 described above, and it is similarly effective in removing the residue and the reaction secondary product adhering to the inside of the processing container 501 or the wafer W.

The Seventh Embodiment

Figure 7:
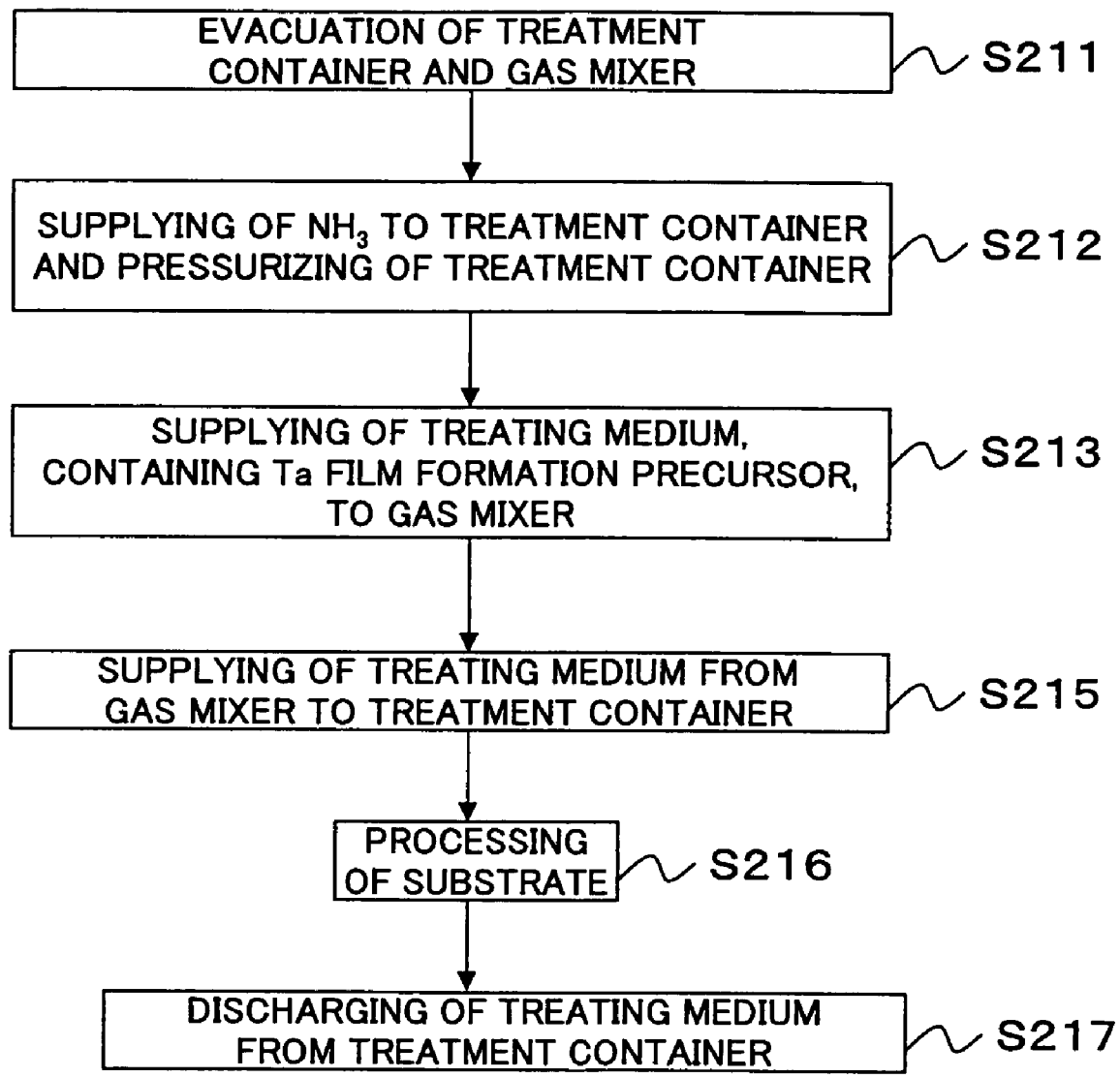
FIG. 7 is a diagram showing the process flow of the substrate processing method according to the invention.

Next, the process flow in the second half of the second step is shown in FIG. 7.

The nitride film of the metal is formed in the second half process. In FIG. 7, the elements which are the same as corresponding elements described above are designated by the same reference numerals, and a description thereof will be omitted.

The step 211 is the same as the step 101.

Next, in step 212, the valves 515 and 540b are opened, and the gas of a nitrogen compound, for example, NH3, is supplied to the processing container 501. In that case, pressurization is performed using the booster pump 517b. Moreover, the area 501B including the processing container 501 and the gas mixer 502 is heated with the heater. Thus, NH3 in the processing container 501 is made in the condition which exceeds the critical point of NH3.

At the critical point, the temperature of NH3 is 132.25 degrees C., and the pressure thereof is 11.33 MPa. The temperature and pressure of the processing container 501 is controlled to beyond the critical point concerned, and the processing container 501 is in the state where it is filled with NH3 of the supercritical state.

Thus, when the processing medium which contain NH3 of the supercritical state is subsequently introduced into the processing container 501 by raising the pressure in the processing container 501 beforehand, it is possible to prevent the pressure of the processing medium concerned from changing rapidly.

After the processing container 501 concerned is at a predetermined pressure, the wafer W is heated by the substrate heater 501a, and the temperature thereof is maintained at 250 degrees C.-500 degrees C.

The valves 515 and 540b are closed after a predetermined time progresses.

Next, in step 213, the solid material 526a which is the Ta film formation precursor held at the solid material container 525a is introduced into the gas mixer 502.

Before shifting to this step 213, the valve 514 and the valve 528a are opened beforehand, and the solid material container 525a is changed into a pressurization state by CO2 using the booster pump 517a.

The processing container 525a is in the range of the area 501B, and it is heated with the heater, so that CO2 of the supercritical state is generated within the solid material container 525a.

Furthermore, CO2 of the supercritical state concerned has the high solubility of the precursor, the solid material 526a which is the Ta film formation precursor (which is TaF5, for example) is fully dissolved in CO2 of the supercritical state concerned, and the processing medium is formed.

Then, in this step 213, the valve 527a is opened, and the processing medium concerned is supplied to the gas mixer 502.

In order to maintain the pressure of the solid material container 525a in that case, the valve 528a is opened and closed, if needed.

After opening the valve 527a for a predetermined time, the valve 527a is closed.

Next, in step 215, the valve 509 is opened and the processing medium containing CO2 of the supercritical state from the gas mixer 502 is introduced into the processing container 501 which is beforehand filled in the step 212 with NH3 of the supercritical state from the gas mixer 502.

Pressure regulation is performed by opening and closing of the valve 516a, if needed, and the supercritical state in the processing container 501 is maintained.

In the following step 216, film formation of a TaN film is performed on the wafer W which is the processed substrate, and it shifts to the following step 207 after a predetermined time progresses.

In the step 207, the wafer W is maintained at 250 degrees C.-500 degrees C. by the substrate heater 501a.

As described above, NH3 of the supercritical state has a very high mobility and a good diffusibility, and it is possible to form the metal nitride film concerned efficiently on the bottom and side wall of a fine pattern of 0.1 micrometer or less, and it is possible to acquire a good coverage of the film on the pattern.

The following step 217 is the same as the step 107.

In the present embodiment, the dissolution of the processing medium in the solid material container 525a, and the preliminary pressurization of the processing container 502 are performed using CO2 of the supercritical state, and the preliminary pressurization of the processing container 501 is performed using NH3 of the supercritical state. However, even if the medium of the supercritical state of the mixed medium of NH3 and CO2 concerned is used, the same result is obtained.

In addition, the nitriding compound is not limited to NH3 but other nitrogen compounds can be used similarly.

The Eighth Embodiment

Figure 8:
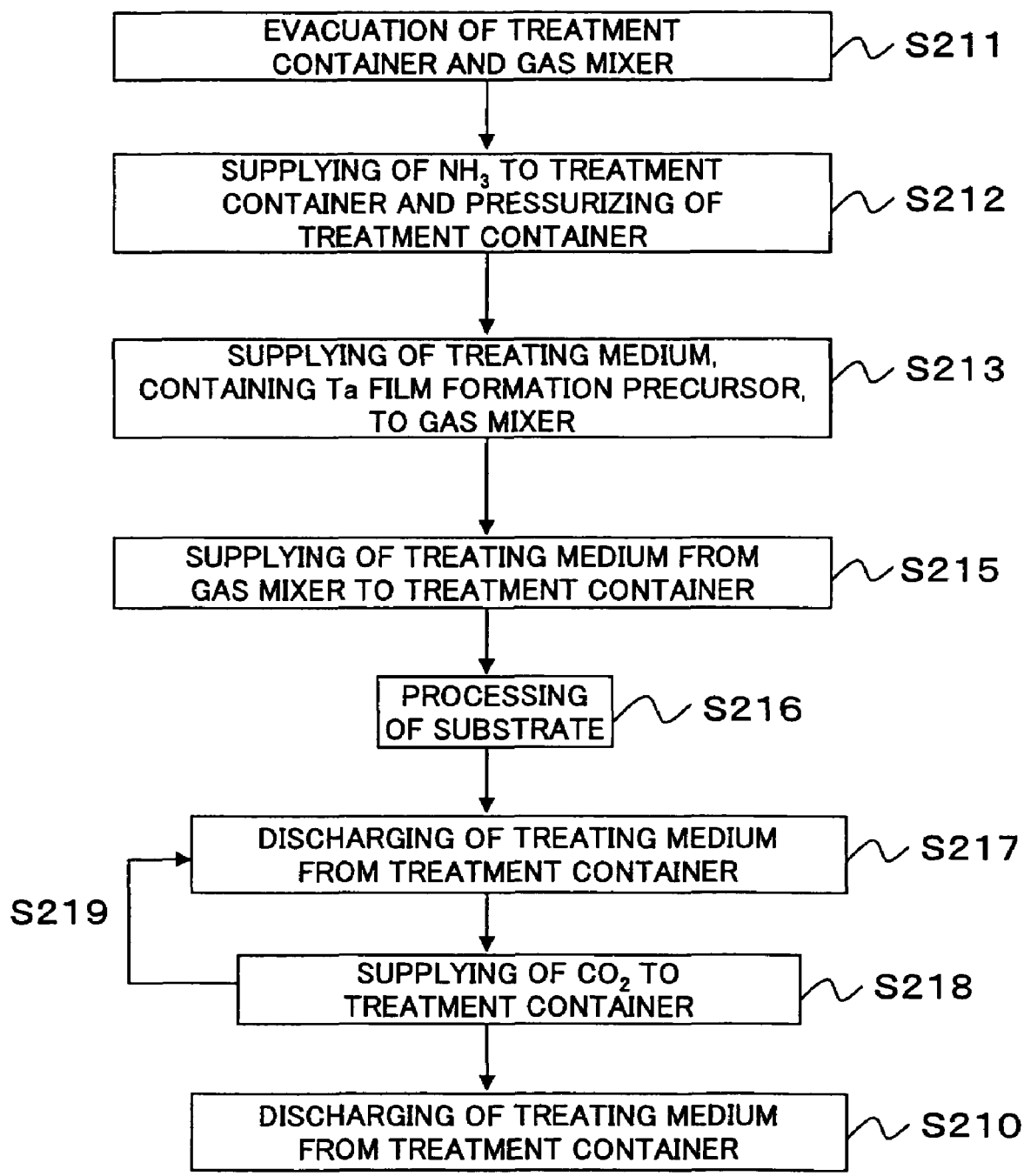
FIG. 8 is a diagram showing the process flow of the substrate processing method according to the invention.

The seventh embodiment shown in FIG. 7 can be modified as in the eighth embodiment shown in FIG. 8. The process flow in the second half of the second step is shown in FIG. 8.

In FIG. 8, the elements which are the same as corresponding elements described above are designated by the same reference numerals, and a description thereof will be omitted.

The steps 218-220 in FIG. 8 are the same rinse processes as the steps 108-110, and it is effective in removing the residue which adhered to the inside of the processing container 501, or the wafer W similarly and the by-product.

Although, in the fifth through eighth embodiments, the example which forms the laminated film of a metal film and a metal nitride film has been shown as a Cu diffusion preventing film, the present invention is not limited to this.

For example, what is necessary is just to skip the TaN film formation process which formed Cu diffusion preventing film only at the process of the fifth embodiment or the sixth embodiment, and was shown in the seventh embodiment or the eighth embodiment as a Cu diffusion preventing film, when forming the single layer film of Ta. Moreover, what is necessary is just to skip Ta film formation process which formed Cu diffusion preventing film only at the process of the seventh embodiment or the eighth embodiment, and was shown in the fifth embodiment or the sixth embodiment, when forming the single layer film of TaN similarly.

The Ninth Embodiment

Figure 9:
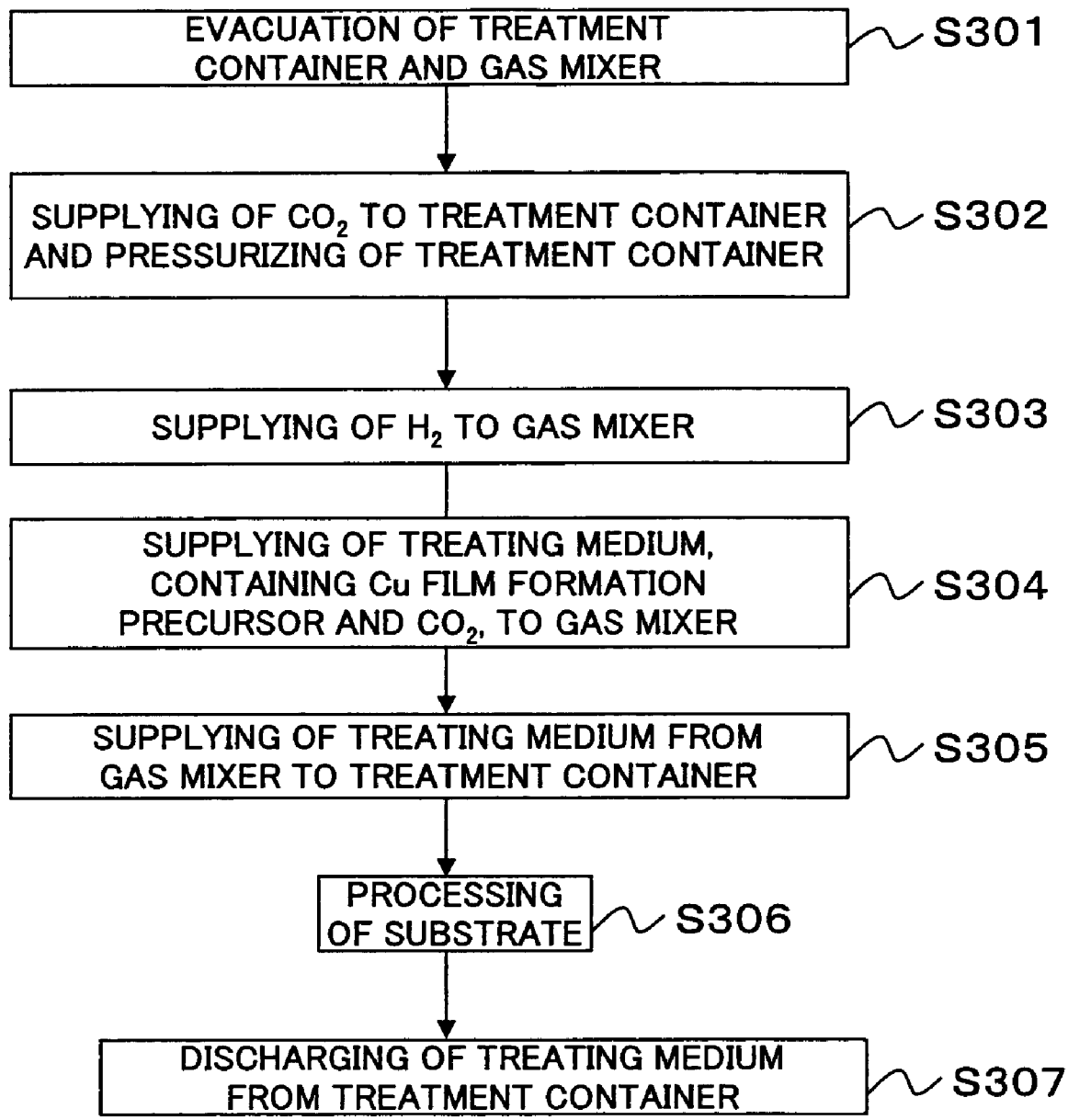
FIG. 9 is a diagram showing the process flow of the substrate processing method according to the invention.

Next, the contents of the process flow of the third step are shown in FIG. 9 as the ninth embodiment. The third step is a process which forms Cu film on the wafer W.

In order to form the Cu film concerned, the case where a solid material is used as a Cu film formation precursor, and a liquid material may be used, but the process flow in the case of using a solid material is first shown in FIG. 9.

As shown in FIG. 9, steps 301 and 302 are the same as the steps 101 and 102 first. However, wafer W is held by the substrate heater 501a at 150 degrees C.-400 degrees C.

Next, in step 303, after opening the valve 530 wide and carrying out given amount introduction of H2 from the H2 supply line 529 at the gas mixer 502, the valve 530 is closed. The gas mixer 502 is filled with the H2 concerned.

Next, in step 304, the solid material 526b which is Cu film formation precursor held at the solid material container 525b is introduced into the gas mixer 502.

First, in shifting to this step 304, the valves 514 and 528b are opened beforehand, and the solid material container 525b is changed into a pressurization state by CO2 using the booster pump 517a.

The processing container 525b is the range of the area 501B, and since it is heated with the heater, CO2 of a supercritical state is generated within the solid material container 525b.

Furthermore, since CO2 of the supercritical state concerned has the high solubility of a precursor, solid material 526b which is the Cu film formation precursor and which is Cu+2 (hexafluoroacetylacetonate) 2, for example fully dissolves in CO2 of the supercritical state concerned, and processing medium are formed in it.

Then, in this step 304, the valve 527a is opened, and the processing medium concerned are supplied to the gas mixer 502.

In order to maintain the pressure of the solid material container 525b in that case, the valve 528b is opened and closed if needed.

After opening the valve 527b wide predetermined time, the valve 527b is closed.

Next, in step 305, the valve 509 is opened and the processing medium concerned which contain CO2 of a supercritical state from the gas mixer 502 are introduced into the processing container 501 from the gas mixer 502.

Pressure regulation is performed by opening and closing of the valve 516 if needed, and the supercritical state of CO2 is maintained.

In the following step 306, on the wafer W which is the processed substrate, the reaction represented by the following formula:

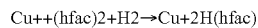

Cu++(hfac)2+H2→Cu+2H(hfac)

where "hfac" denotes hexafluoroacetylacetonate takes place, and the film formation of Cu film is performed.

It shifts to the following step 307 after predetermined time progress. In this step, the wafer W is maintained at about 150 degrees C.-400 degrees C. by the substrate heater 501a.

As described above, CO2 of a supercritical state has very high mobility, since it is rich in diffusibility, can form the Cu film concerned efficiently also on the fine bottom and fine side wall of 0.1 micrometer or less of a pattern, and can acquire the good coverage characteristic on them.

The following step 307 is the same as the step 107. The Cu film formation precursor is even if it uses Cu+2(acetylacetonate)2, Cu+2(2, 2, 6, and 6-tetra-methyl 3,5-heptanedione)2, etc. for others although Cu+2(hexafluoroacetylacetonate) 2 was used in this embodiment. It is possible to obtain the same result.

Figure 10A:
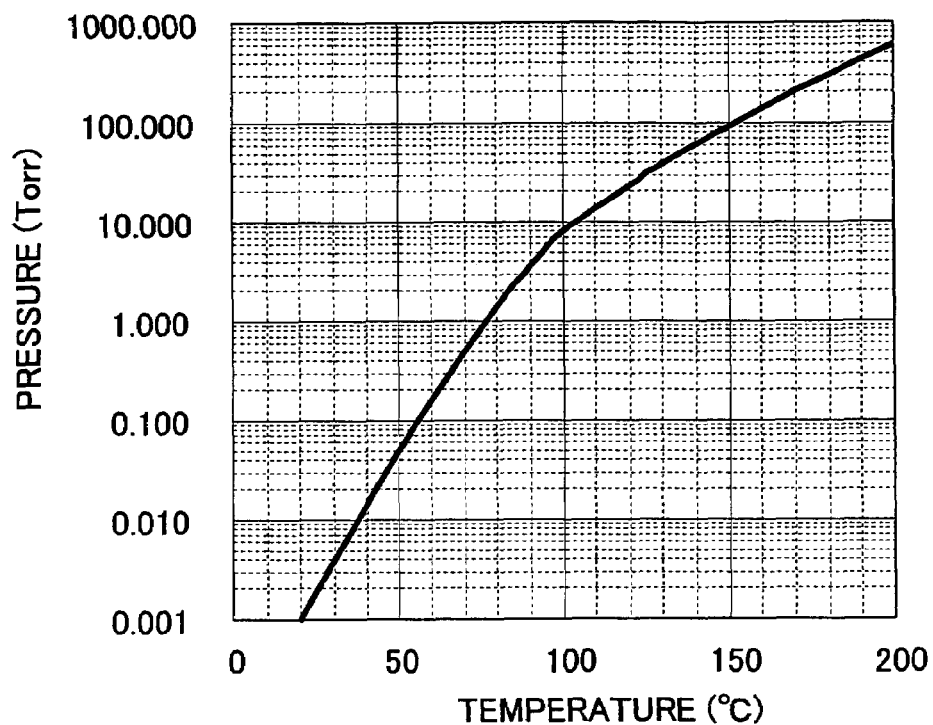
FIG. 10A is a diagram showing the saturated-vapor-pressure curve of Cu film formation precursor.
Figure 10B:
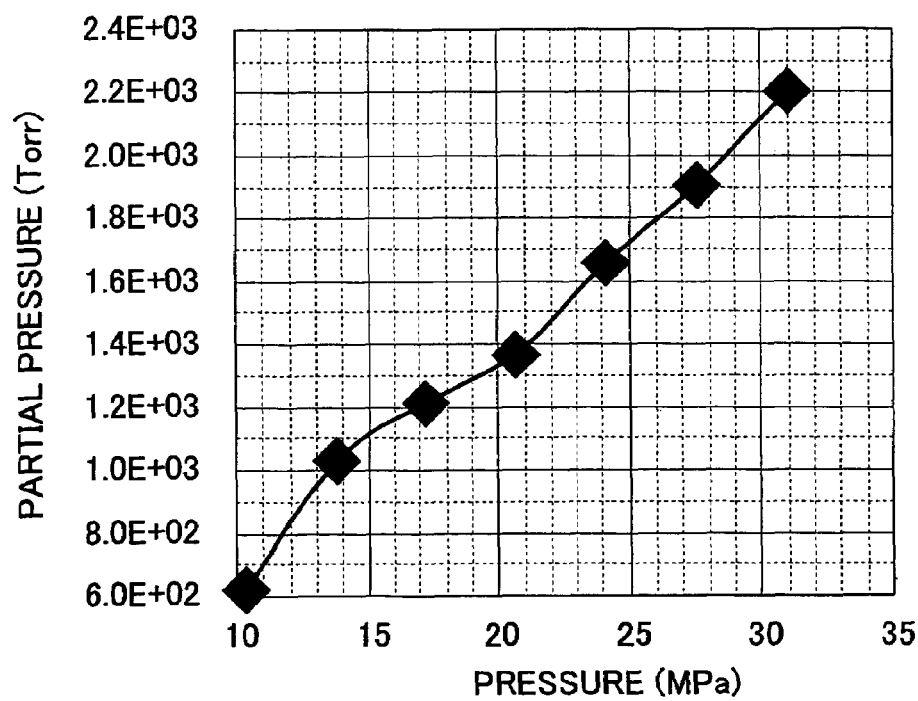
FIG. 10B is a diagram showing the partial pressure of Cu film formation precursor in $CO_2$ of a supercritical state.

Some examples in which the Cu film formation precursor shows high solubility to CO2 of a supercritical state are shown in FIG. 10A and FIG. 10B (FIG. 10A: R. E. Sievers and J. E. Sadlowski, Science 201 (1978) 217, and FIG. 10: A. F. Lagalante, B. N. Hansen, T. J. Bruno, Inorg. Chem, 34 (1995))

FIG. 10A is the example of a saturated-vapour-pressure curve of Cu+2(hexafluoroacetylacetonate)2 which is the Cu film formation precursor. For example, it is founded that the saturated vapour pressure at 40 degrees C. is about 0.01 Torr.

On the other hand, FIG. 10B is the example of the partial pressure of Cu+2(hexafluoroacetylacetonate)2 in the CO2 of a supercritical state at 313.15K (40 degrees C.). For example, it is found that the partial pressure concerned at the time of 15 MPa which is in a supercritical state is about 1000 Pa or higher, which shows that the density of Cu+2(hexafluoroacetylacetonate)2 existing in the CO2 of the supercritical state is higher than that in the above-mentioned case of the usual saturation which is about 1000 Pa or more, which shows a very high solubility.

Thus, the medium of a supercritical state having a high solubility with mobility and diffusibility, while the film formation rate is maintained, the film formation can be performed with good coverage of a fine wiring pattern.

The 10th Embodiment

Figure 11:
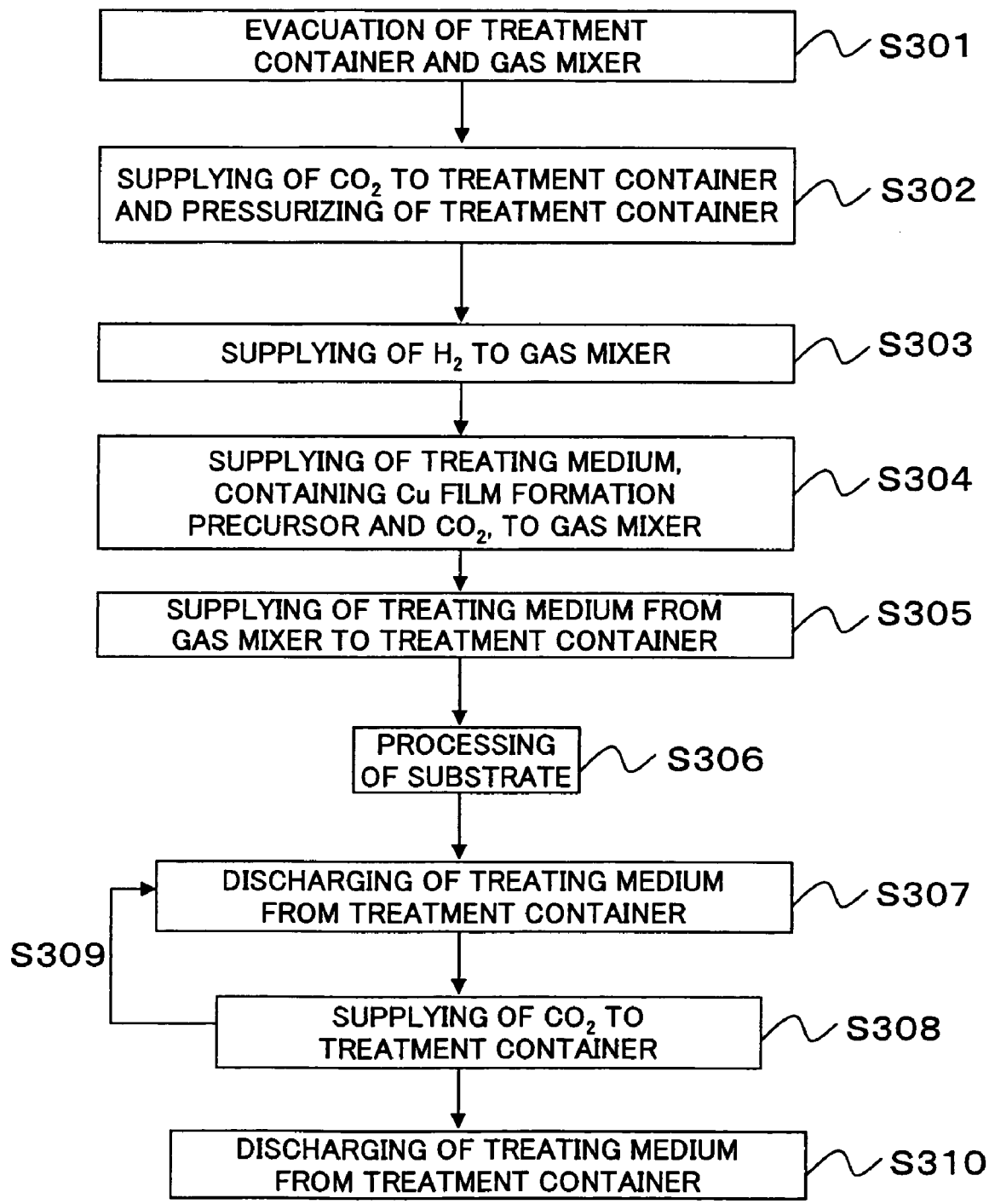
FIG. 11 is a diagram showing the process flow of the substrate processing method according to the invention.

The ninth embodiment can be modified as in the 10th embodiment which is shown in FIG. 11. However, the same referential mark is given to the portion explained previously among a diagram, and explanation is omitted.

Although the steps 308-310 in FIG. 11 are added with reference to FIG. 11, the steps 308-310 are the same rinse process as the steps 108-110. And, the effect in which the residue and the by-product inside the processing container 501 or on the wafer W can be removed is attained similarly.

The 11th Embodiment

Next, the example at the time of using a liquid material for Cu film formation precursor is shown as an example of the process flow of the third step.

Figure 12:
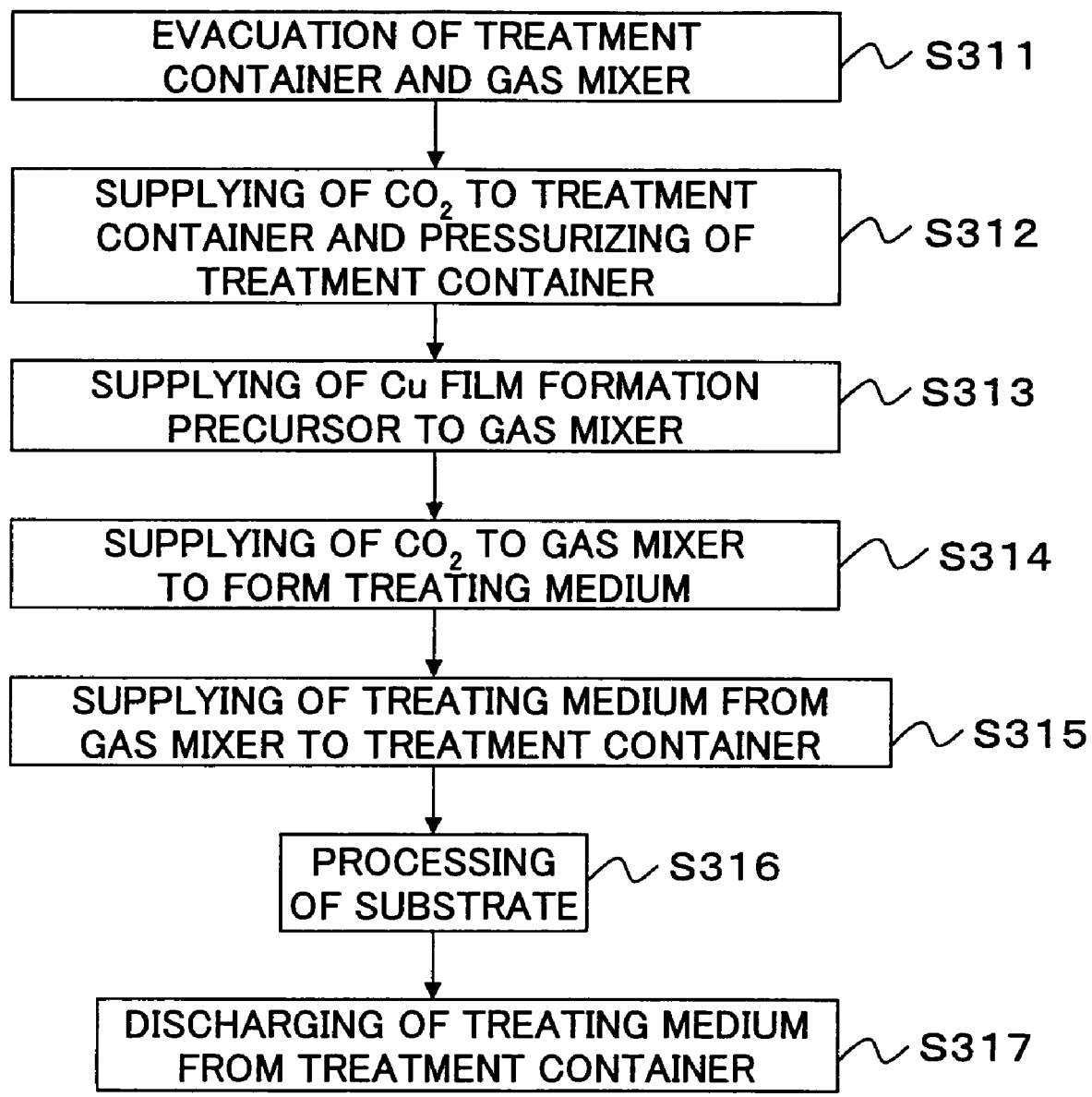
FIG. 12 is a diagram showing the process flow of the substrate processing method according to the invention.

FIG. 12 is a diagram showing the process flow of the third step at the time of using a liquid material for Cu film formation precursor.

However, the same referential mark is given to the portion explained previously among a diagram, and explanation is omitted.

As shown in FIG. 11, step 311 and step 312 are the same as the step 301 and step 302. However, the wafer W is maintained at 100 degrees C.-350 degrees C. with the substrate heater 501a.

Next, in step 313, the liquid material 523 which is the Cu film formation precursor Cu+1(hexafluoroacetylacetonate) (trimethyl vinylsilane) is extruded by the inert gas, such as Ar, supplied from the gas lines 522, and is supplied to the gas mixer 502 of a decompression state from the liquid material supply line 518, and after a predetermined time is elapsed the valve 532 is closed.

Next, in step 314, the valve 516 is opened, CO2 of a supercritical state is introduced into the gas mixer 502, and CO2 of the supercritical state concerned and the liquid material 523 are fully diffused and mixed, so that the processing medium is formed. After a predetermined time is elapsed, the valve 516 is closed.

Next, in step 315, the valve 509 is opened, and the processing medium concerned containing CO2 of a supercritical state is introduced into the processing container 501 from the gas mixer 502.

Pressure regulation is performed by opening and closing of the valve 516 if needed, and the supercritical state of CO2 is maintained.

In step 316, on the wafer W which is the processed substrate, the reaction represent by the following formulas:

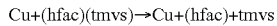

Cu+(hfac)(tmvs)→Cu+(hfac)+tmvs

2Cu+(hfac)→Cu+Cu++(hfac)2 where "hfac" denotes hexafluoroacetylacetonate, and "tmvs" denotes trimethylvinylsilane, takes place, and the film formation of Cu film is performed.

It shifts to the following step 317 after a predetermined time progresses.

In this step, the wafer W is maintained at about 100 degrees C.-350 degrees C. with the substrate heater 501a.

As described above, CO2 of a supercritical state has very high mobility, since it is rich in diffusibility, can form the Cu film efficiently on the fine bottom and fine side wall of 0.1 micrometer or less of a pattern, and can acquire the good coverage characteristic on them.

The following step 317 is the same as the step 307.

In the present embodiment, as the Cu film formation precursor, $Cu^{+1}$(hexafluoroacetylacetonate) (trimethylvinylsilane) is used. Alternatively, a Cu film formation precursor which contains $Cu^{+1}$ (hexafluoroacetylacetonate) and scillirolefinligand may be used, the scillirolefinligand being any chosen from among the following: allyl-oxytrimethylscillire (aotms), dimethyl acetylene(2-butyne), 2-methyl-1-hexine-3-in (MHY), 3-hexine-2,5-dimethoxy(HDM), 1,5-cyclooctadiene(1,5-COD), and vinyltrimethoxylene (VTMOS). Even when the alternative Cu film formation precursor is used, it is possible to obtain the same result.

The film quality of Cu film may be improved by adding the following additives to the processing medium used in this embodiment as follows.

For example, by adding $H_2O$ to the processing medium, the incubation time at the time of growing up Cu film on the Cu diffusion preventing film described above in the fifth through eighth embodiments can be shortened, and a substantial deposition rate can be raised. Moreover, by adding (CH3)I or (C2H5)I, when forming Cu film in a fine pattern, it is possible to carry out the bottom-up filling (Kew-Chan Shim, Hyun-Bae Lee, Oh-Kyum Kwon, Hyung-Sang Park, Wonyong Koh and Sang-Won Kang, "Bottom-up Filling of Submicrometer Features in Catalyst-Enhanced Chemical Vapor Deposition", J. Electorochem. Soc. 149(2) (2002) G109-G113). For example, even on via holes of 0.1 micrometer or less, a quality Cu film can be formed without creating void.

The 12th Embodiment

Figure 13:
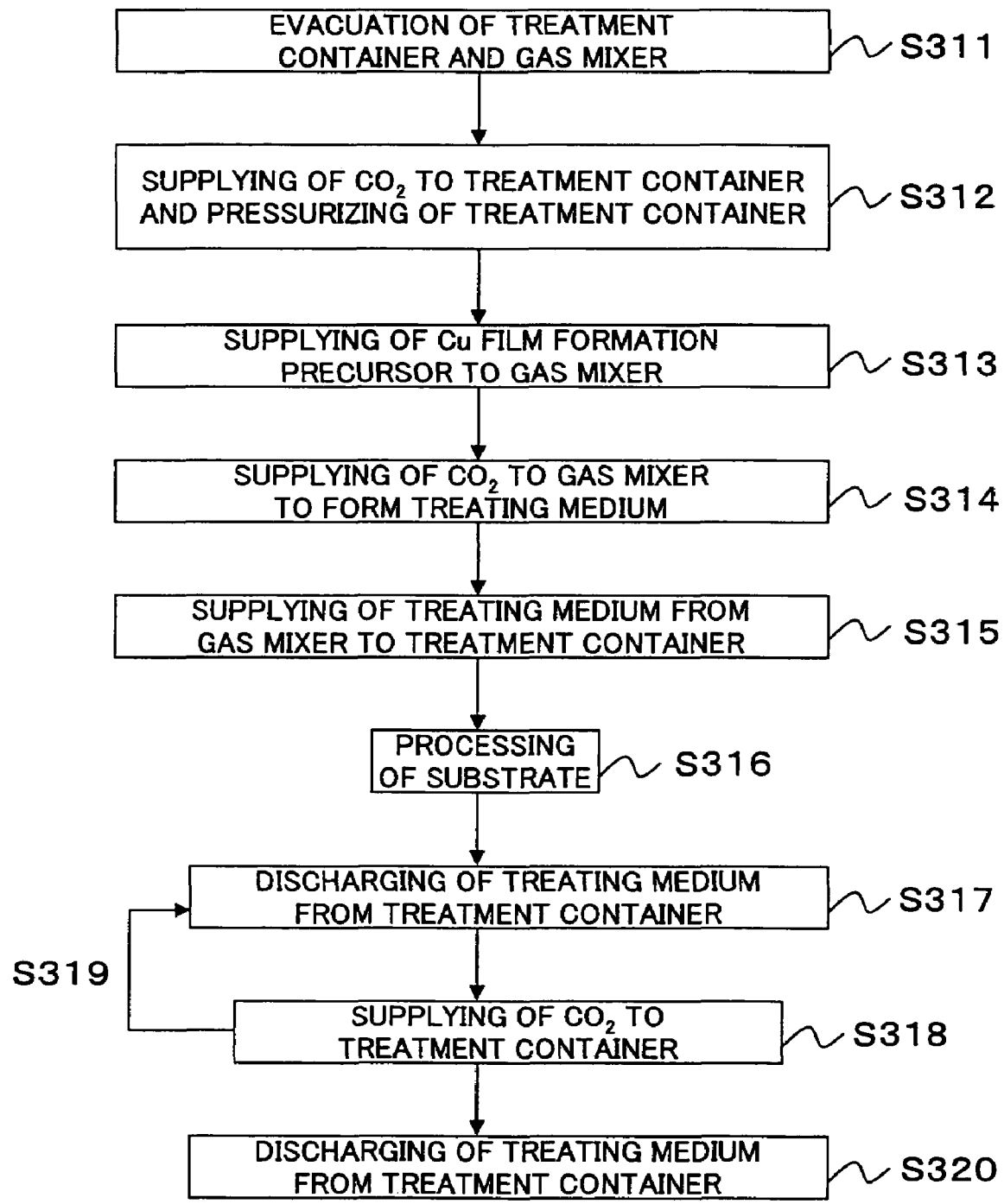
FIG. 13 is a diagram showing the process flow of the substrate processing method according to the invention.

The 11th embodiment can be modified as in the 12th embodiment which is shown in FIG. 13. However, the same referential mark is given to the portion explained previously among a diagram, and explanation is omitted.

As shown in FIG. 13, the rinse process of steps 318-320 is added to the embodiment of FIG. 13, and this is the same as that of the steps 108-110 in the previous embodiment. Similarly, the present embodiment provides the effect which removes the residue and the by-product on the processing container 501 inside or the wafer W.

The 13th Embodiment

Figure 14:
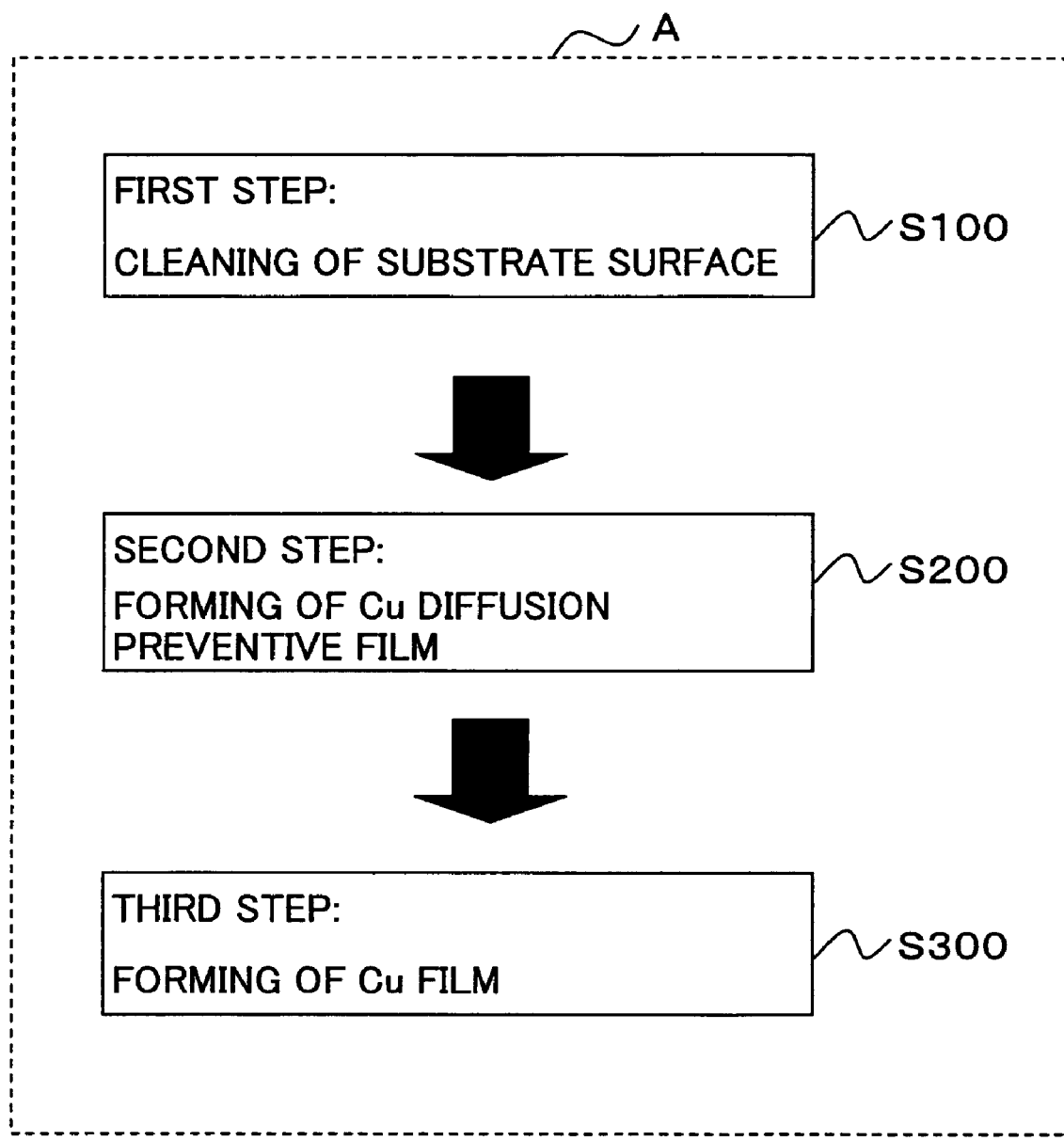
FIG. 14 is a diagram showing the process flow of the substrate processing method according to the invention.

Although the first step, the second step, and the third step have been explained in the foregoing, the first through third steps are performed in the substrate processing device 500, which is shown in FIG. 14.

Although the first step, the second step and the third step (S100, S200 and S300) which are carried out according to the invention are shown in FIG. 14, all the first through third steps surrounded by the region A are performed in the substrate processing device 500.

It is possible to modify the processing method by using another substrate processing device for this, as shown below.

Figure 15:
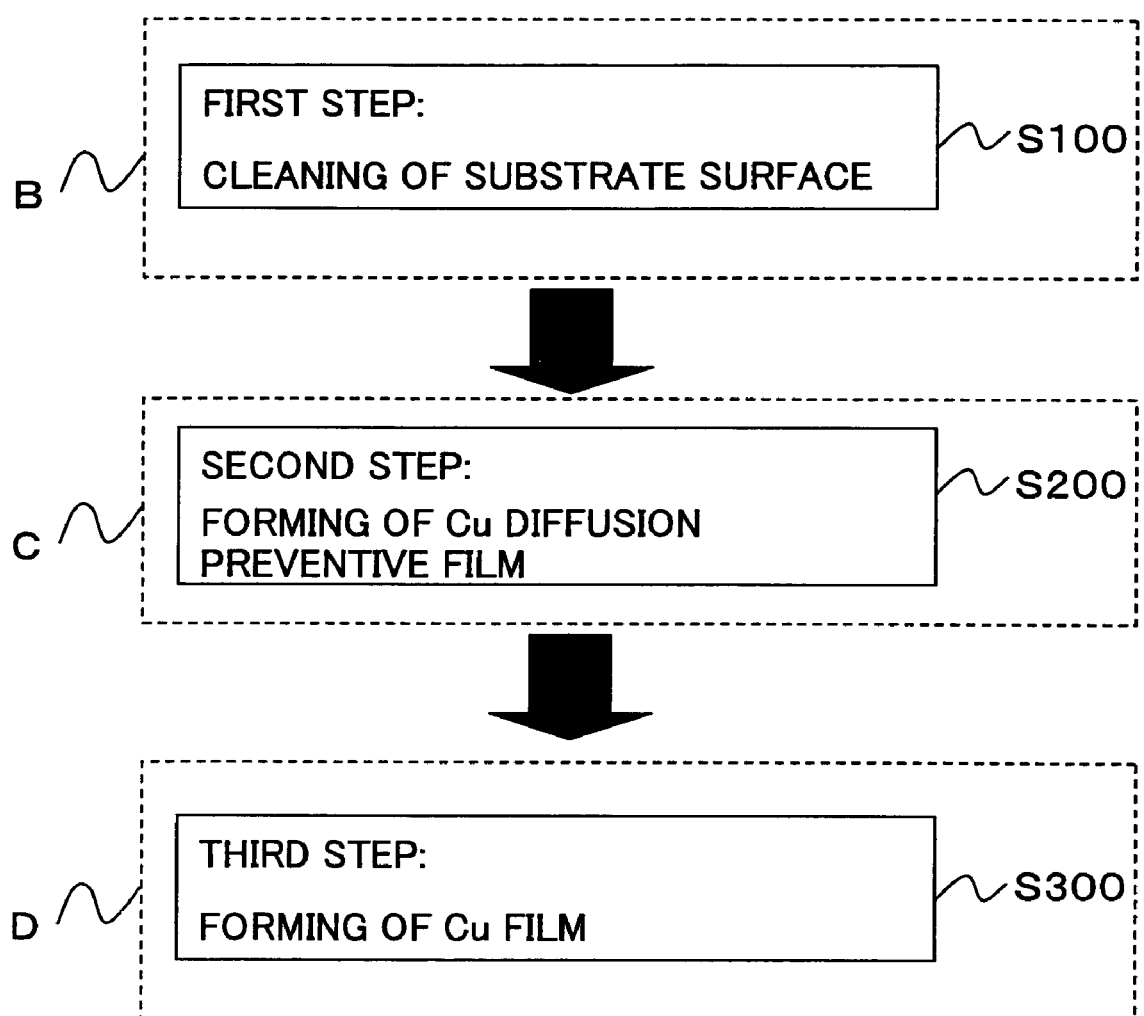
FIG. 15 is a diagram showing the process flow of the substrate processing method according to the invention.

FIG. 15 shows another embodiment of the substrate processing method shown in FIG. 14.

For example, the first step shown in the region B is performed in the substrate processing device 500. Then, the processed substrate is conveyed to another substrate processing device, and the second step shown in the region C is performed. Finally, the processed substrate is conveyed to another substrate processing device, and the third step shown in the region D is performed.

Thus, it is also possible to perform the first through third steps continuously by conveying the processed substrate from one substrate processing device to another substrate processing device.

Figure 16:
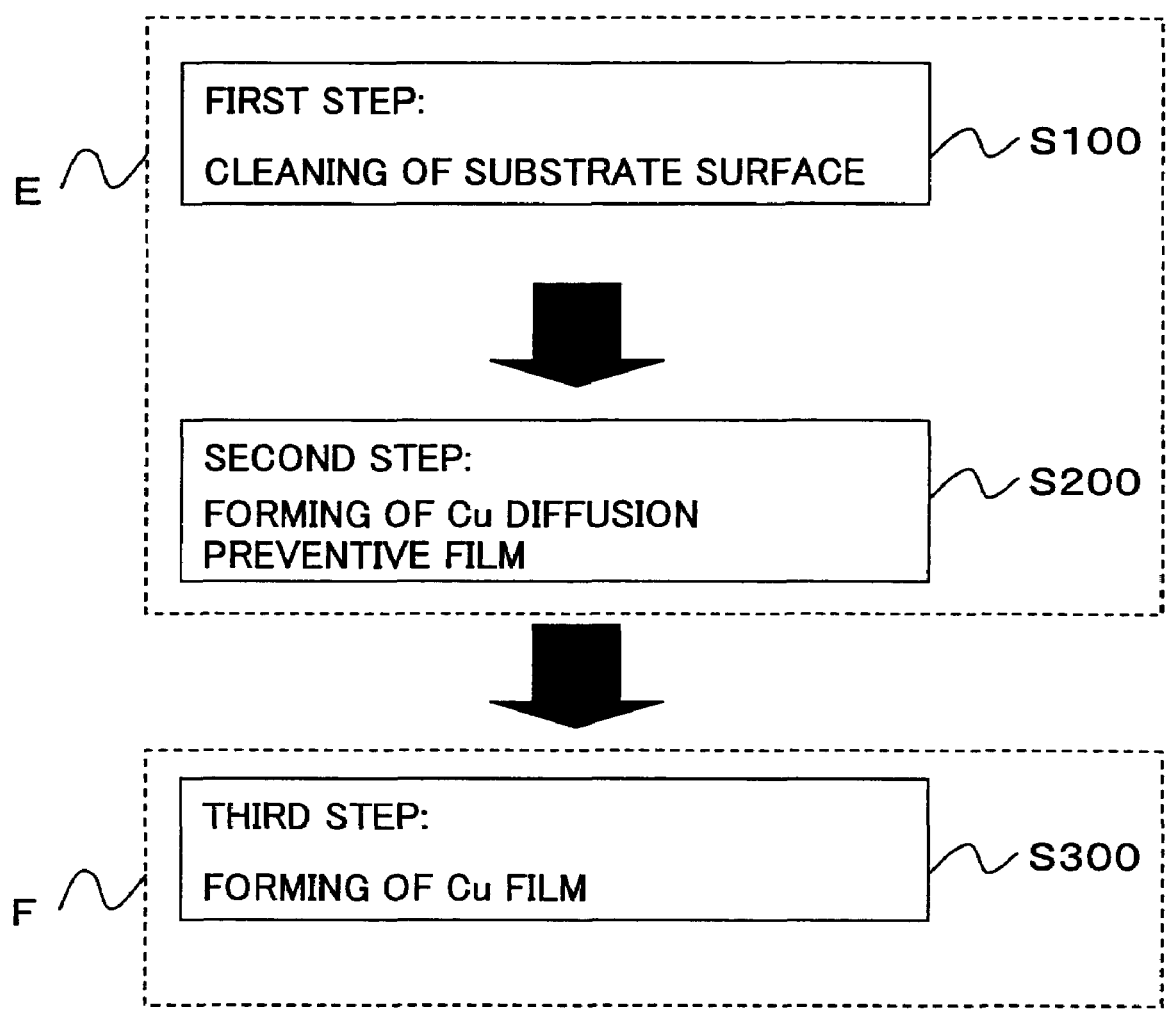
FIG. 16 is a diagram showing the process flow of the substrate processing method according to the invention.
Figure 17:
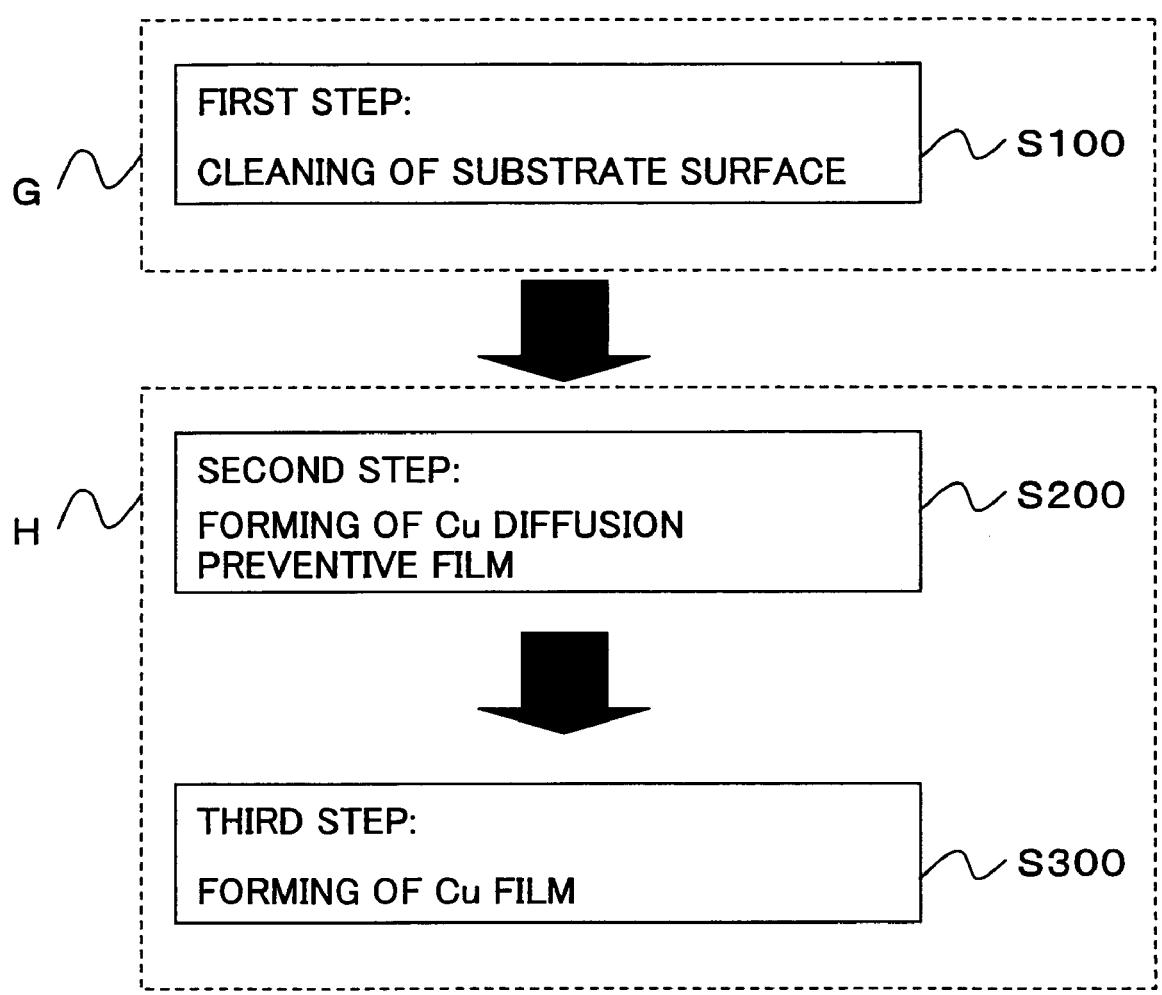
FIG. 17 is a diagram showing the process flow of the substrate processing method according to the invention.

Another modification of the substrate processing method shown in FIG. 14 is shown in FIG. 16 and FIG. 17.

However, the same referential mark is given to the portion explained previously among a diagram, and explanation is omitted.

As shown in FIG. 16, the substrate processing device 500 performs the first and second steps shown in the region E, for example, the processed substrate is conveyed to another substrate processing device, and the third step shown in the region F is performed.

As shown in FIG. 17, the substrate processing device 500 performs the first step shown in the region G, for example, and the processed substrate is conveyed to another substrate processing device.

When the first and second steps shown in the region H are performed, the same result as in the case where the substrate processing device 500 performs the first through third steps as shown in FIG. 14 is obtained. When conveying the processed substrate, not putting to the atmosphere containing oxygen is important, and it is necessary to convey the bottom of decompression, or the inside of inert gas.

The 14th Embodiment

Next, the procedure of the manufacturing process of the semiconductor device using the substrate processing method of the invention will be explained with reference to FIG. 18A to FIG. 18F.

Figure 18A:
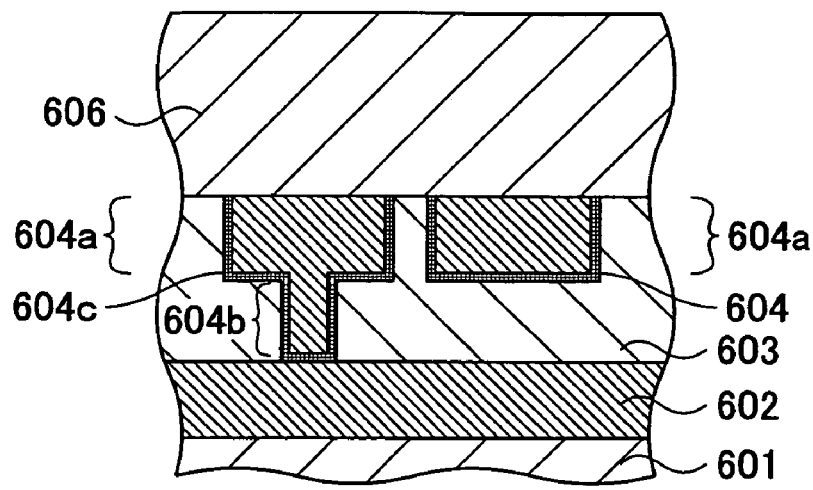
FIG. 18A, FIG. 18B and FIG. 18C are diagrams showing the semiconductor device manufacturing method using the substrate processing method according to the invention.

As shown in FIG. 18A, the insulating layer 601, such as a silicon oxide, is formed to cover the element (not shown), such as a MOS transistor formed on the semiconductor substrate which is made of silicon.

The element concerned is electrically connected to the wiring layer (not shown) which is made of W, and the wiring layer 602 which is made of Cu. These layers are connected to the element concerned and formed.

On the silicon oxide 601, the first insulating layer 603 is formed so as to cover the Cu layer 602. The groove part 604a and hole part 604b are formed in the insulating layer 603.

The Cu layer 604 which is a wiring layer is formed in the groove part 604a and hole part 604b, and this layer is electrically connected with the above-mentioned Cu layer 602.

The barrier layer 604c is formed in the contact surface of the first insulating layer 603 and the Cu layer 604, and in the contact surface of the Cu layer 602 and the Cu layer 604. The barrier layer 604c prevents that Cu is spread from the Cu layer 604 to the first insulating layer 603, and serves as the adhesion layer which raises the adhesion of the Cu layer 604 and the first insulating layer 603.

The barrier layer 604c is made of the metal and the metal nitride film concerned, for example, Ta and TaN.

The second insulating layer 606 is formed so that the Cu layer 604 and the first insulating layer 603 may be covered.

In this embodiment, the substrate processing method according to the invention is applied to the second insulating layer 606, and the Cu layer and the barrier layer are formed in it.

Figure 18B:
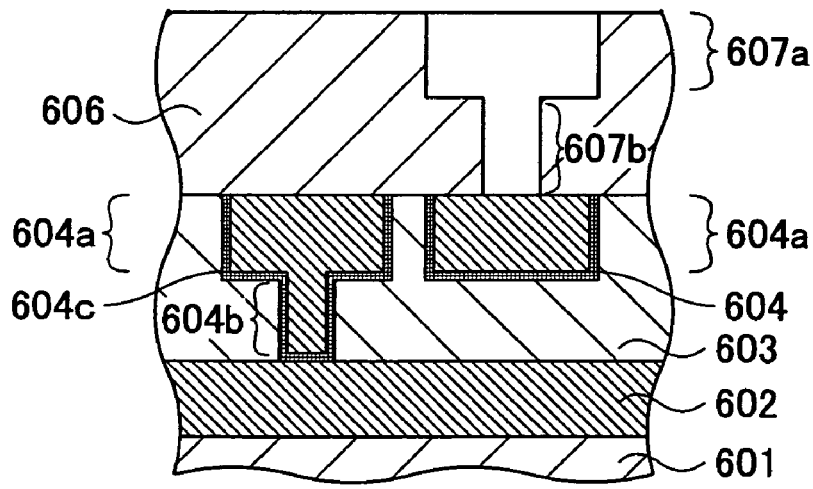

Next, as shown in FIG. 18B, the groove part 607a and hole part 607b are formed in the second insulating layer by the dry etching method.

Figure 18C:
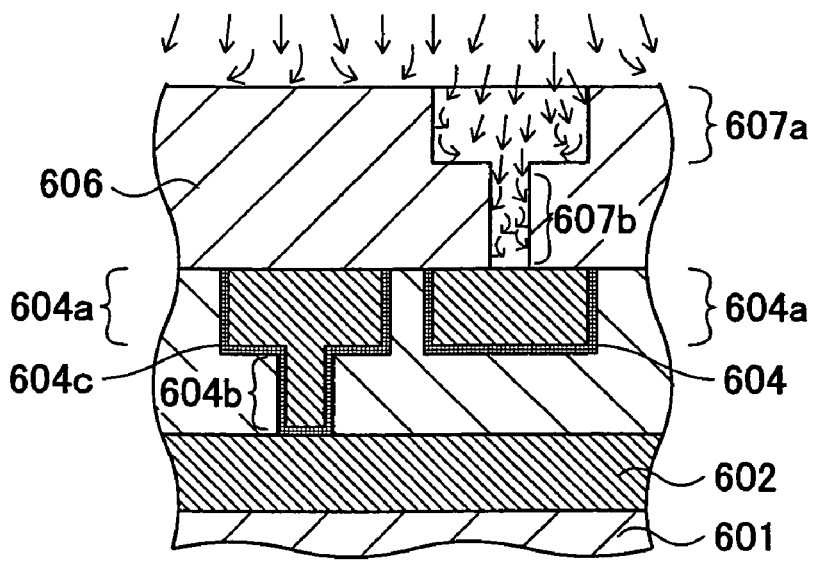

Next, as shown in FIG. 18C, the first step of the substrate processing method according to the invention is applied.

As described above, the substrate surface is cleaned by using $CO_2$ of the supercritical state and the etching agent.

For example, the oxide film formed in the surface of the Cu layer 604 exposed to the bottom of the hole part 607b is removed, and the adhesion of the barrier layer formed at the following process and the Cu layer 604 is raised.

It is effective in removing the residue matter and the by-product of the etching agent remaining inside the groove part 607a and the hole part 607b.

Figure 18D:
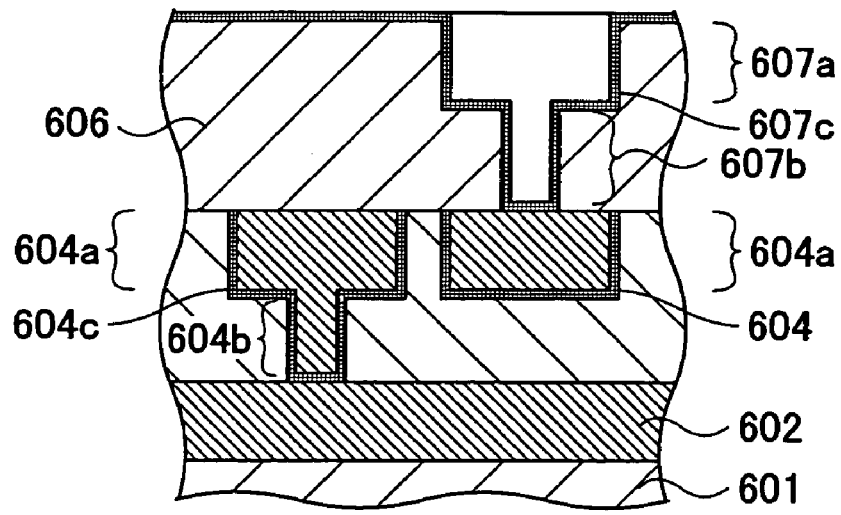
FIG. 18D, FIG. 18E and FIG. 18F are diagrams showing the semiconductor device manufacturing method using the substrate processing method according to the invention.

Next, as shown in FIG. 18D, the second step according to the invention is applied and the barrier layer 607c is formed on the second insulating layer 606 top and the exposure side of the Cu layer 604.

For example, the barrier layer 607c in this case is made of a Ta film and a TaN film, and at the second step, as described above, the Ta film is formed in the first half process, and the TaN film is formed in the second half process, so that the barrier layer 607c which is made of Ta/TaN is formed.

As described above, in this process, $CO_2$ and $NH_3$ of the supercritical state are used, they have good diffusibility, and the barrier film 607c can be formed also in the bottom and wall part of the fine hole part 607b and the fine groove part 607a with a good coverage.

Figure 18E:
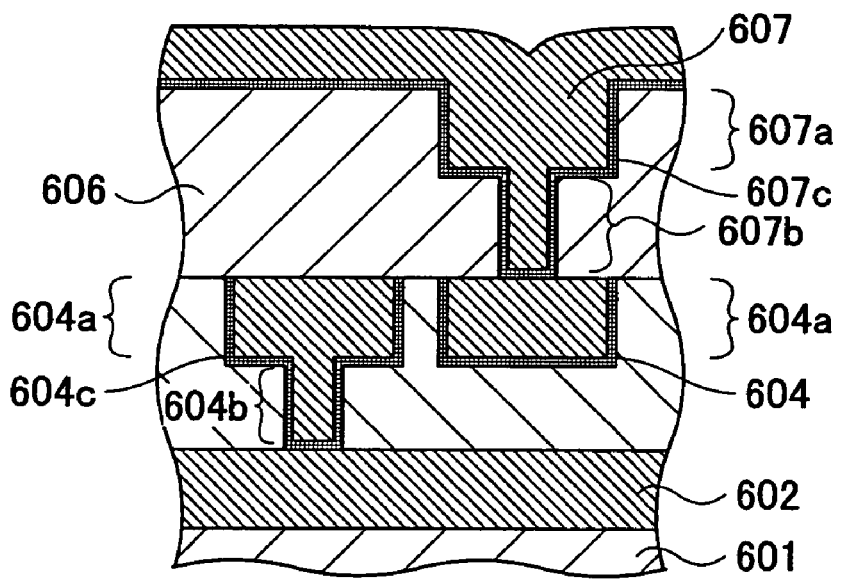

Next, as shown in FIG. 18E, the third step according to the invention is applied and the Cu layer 607 is formed on the barrier layer 607c. As described above, the $CO_2$ of the supercritical state is used in this case. Since $CO_2$ of the supercritical state with the Cu film formation precursor being dissolved has good diffusibility, the Cu layer 607 can be formed in the bottom and wall part of the fine hole part 607b and the fine groove part 607a with a good coverage.

Figure 18F:
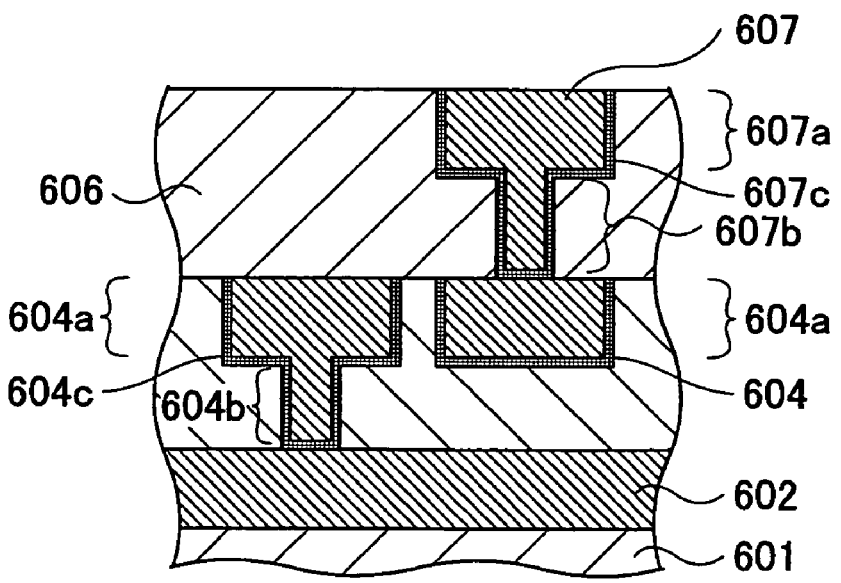

Next, as shown in FIG. 18F, the Cu layer 607 upper part and the barrier film 607c are ground by the CMP method, and the Cu wiring of the second insulating layer 606 is completed. After this process is performed, it is possible to further form the (2+n)th (n: a natural number) insulating layer in the upper part of the second insulating layer, and to form the Cu wiring on each insulating layer with the application of the substrate processing method according to the invention.

It is possible to apply the invention also to formation of the barrier film 604c and the Cu layer 604 which are formed in the first insulating layer.

INDUSTRIAL APPLICABILITY

According to the present invention, it is possible to perform both the formation of a Cu diffusion preventing film and the embedding of a Cu film using the medium of a supercritical state. Since the solubility of the precursor compound containing metal, for example, Cu, or Ta, is high and the medium of a supercritical state has good mobility and high diffusibility, it is possible to perform the formation of the Cu diffusion preventing film and the embedding of the Cu film in a very fine pattern.

The invention claimed is:

1. A substrate processing method comprising:
   a first step of processing a substrate by supplying a first processing medium containing a first medium of a supercritical state onto the substrate;
   a second step of forming a Cu diffusion preventing film on the substrate by supplying a second processing medium containing a second medium of a supercritical state onto the substrate; and
   a third step of forming a Cu film on the substrate by supplying a third processing medium containing a third medium of a supercritical state onto the substrate,
   wherein the second processing medium is made by adding a precursor compound containing Ta to the second medium of the supercritical state, and the precursor compound containing Ta is chosen from a group including $TaF_5$, $TaCl_5$, $TaBr_5$, and $TaI_5$.

2. The substrate processing method according to claim 1 characterized in that the second step comprises a step of removing, after the Cu diffusion preventing film is formed, the second processing medium and a by-product on a surface of the substrate by the second medium of the supercritical state.

3. The substrate processing method according to claim 1 characterized in that the third medium of the supercritical state is $CO_2$ of a supercritical state.

4. The substrate processing method according to claim 1 characterized in that the third step further comprises a step of removing the third processing medium and a by-product on a surface of the substrate by the third medium of the supercritical state after the Cu film is formed.

5. The substrate processing method according to claim 1 characterized in that the first medium of the supercritical state is $CO_2$ of a supercritical state.

6. The substrate processing method according to claim 1 characterized in that, in the first step, a Cu oxide film formed on a Cu surface on the substrate is removed by the first processing medium.

7. The substrate processing method according to claim 1 characterized in that the first step further comprises a step of removing the first processing medium and a by-product on a surface of the substrate by the first medium of the supercritical state after the substrate is processed by the first processing medium.

8. The substrate processing method according to claim 1 characterized in that the first step, the second step, and the third step are performed in a processing container which processes the substrate.

9. The substrate processing method according to claim 1 characterized in that the first step is performed in a first processing container which processes the substrate, the second step is performed in a second processing container, and the third step is performed in a third processing container.

10. The substrate processing method according to claim 1 characterized in that the first step and the second step are performed in a processing container which processes the substrate, and the third step is performed in another processing container.

11. The substrate processing method according to claim 1 characterized in that the first step is performed in a processing container which processes the substrate, and the second step and the third step are performed in another processing container.

12. The substrate processing method according to claim 1 characterized in that the Cu diffusion preventing film is made of any of a film of a metal, a film of a nitride of the metal, and a laminated film of the metal film and the nitride film.

13. The substrate processing method according to claim 2 characterized in that the second step comprises either a step of forming the metal film or the nitride film or a step of forming the laminated film of the metal film and the nitride film.

14. The substrate processing method according to claim 1 characterized in that the second medium of the supercritical state is made of any of $CO_2$ of a supercritical state, a nitriding compound of a supercritical state, and a mixture of the $CO_2$ and the nitriding compound.

15. The substrate processing method according to claim 14 characterized in that the nitriding compound is $NH_3$.

16. The substrate processing method according to claim 1 characterized in that the third processing medium is made by adding a copper-containing precursor compound to the third medium of the supercritical state.

17. The substrate processing method according to claim 16 characterized in that the copper-contained precursor compounds is any of $Cu^{+2}$(hexafluoroacetylacetonate)$_2$, $Cu^{+2}$(acetylacetonate)$_2$ or $Cu^{+2}$(2,2,6,6-tetramethyl-3,5-heptanedione)$_2$.

18. The substrate processing method according to claim 16 characterized in that the copper-contained precursor compound is a compound containing $Cu^{+1}$(hexafluoroacetylacetonate) and scillirolefinligand, the scillirolefinligand being any chosen from among a group including trimethylvinylsilane (tmvs), allyl-oxytrimethyiscillire (aotms), dimethylacetylene(2-butyne), 2-methyl-1-hexine-3-in(MHY), 3-hexine-2,5-dimethoxy(HDM), 1,5-cyclooctadiene(1,5-COD), and vinyltrimethoxylene (VTMOS).

19. The substrate processing method according to claim 1 characterized in that the first processing medium is made by adding an etching agent to the first medium of the supercritical state.

20. The substrate processing method according to claim 19 characterized in that the etching agent is any of a chelating agent, a halogenated compound, an acid, or an amine.

21. A substrate processing method comprising:
    a first step of processing a substrate by supplying a first processing medium containing a first medium of a supercritical state onto the substrate;
    a second step of forming a Cu diffusion preventing film on the substrate by supplying a second processing medium containing a second medium of a supercritical state onto the substrate; and
    a third step of forming a Cu film on the substrate by supplying a third processing medium containing a third medium of a supercritical state onto the substrate,
    wherein the second processing medium is made by adding a precursor compound containing Ta to the second medium of the supercritical state, the precursor compound containing Ta is an organic metallic compound, and the organic metallic compound is either $(C_5H_5)_2TaH_3$ or $(C_5H_5)_2TaCl_3$.

* * * * *